US008810866B2

(12) United States Patent
Fujii

(10) Patent No.: US 8,810,866 B2
(45) Date of Patent: Aug. 19, 2014

(54) OPTICAL DEVICE, OPTICAL SCANNING APPARATUS, AND IMAGE FORMING APPARATUS

(75) Inventor: Toshishige Fujii, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 218 days.

(21) Appl. No.: 13/331,082

(22) Filed: Dec. 20, 2011

(65) Prior Publication Data

US 2012/0162723 A1 Jun. 28, 2012

(30) Foreign Application Priority Data

Dec. 28, 2010 (JP) .................................. 2010-292109
Nov. 1, 2011 (JP) .................................. 2011-240615

(51) Int. Cl.
*H04N 1/04* (2006.01)
*H01J 3/14* (2006.01)
*G03G 15/04* (2006.01)
*F21V 9/16* (2006.01)
*G01J 1/42* (2006.01)
*B41J 27/00* (2006.01)
*G01D 15/14* (2006.01)
*B41J 2/435* (2006.01)
*G02B 6/12* (2006.01)
*G02B 6/00* (2006.01)

(52) U.S. Cl.
USPC ............. 358/474; 250/216; 399/177; 362/84; 356/222; 347/256; 347/232; 347/224; 385/14; 385/136

(58) Field of Classification Search
USPC ............. 358/474; 250/216; 399/177; 362/84; 356/222; 347/256, 232, 224; 385/14, 385/136
See application file for complete search history.

(56) References Cited

U.S. PATENT DOCUMENTS

| 4,544,269 | A | * | 10/1985 | Nose et al. ..................... 356/222 |
| 5,801,402 | A |  | 9/1998 | Shin |
| 2002/0057883 | A1 | * | 5/2002 | Malone et al. ................ 385/136 |
| 2007/0030874 | A1 |  | 2/2007 | Ariga et al. |
| 2011/0199454 | A1 | * | 8/2011 | Ichii .............................. 347/224 |
| 2011/0228035 | A1 | * | 9/2011 | Ishii et al. ...................... 347/232 |
| 2011/0261139 | A1 | * | 10/2011 | Hoshi et al. ................... 347/256 |
| 2011/0299808 | A1 | * | 12/2011 | Matsuoka et al. .............. 385/14 |
| 2012/0106125 | A1 | * | 5/2012 | Yokotani et al. ................ 362/84 |
| 2012/0251182 | A1 | * | 10/2012 | Adachi et al. ................. 399/177 |
| 2013/0062510 | A1 | * | 3/2013 | Fujii et al. ..................... 250/216 |

FOREIGN PATENT DOCUMENTS

| JP | 9-198707 | 7/1997 |
| JP | 10-215020 | 8/1998 |
| JP | 2002-319737 | 10/2002 |
| JP | 2003-204111 | 7/2003 |
| JP | 2005-86027 | 3/2005 |
| JP | 2005-252032 | 9/2005 |

(Continued)

*Primary Examiner* — Charlotte M Baker
*Assistant Examiner* — Rury Grisham
(74) *Attorney, Agent, or Firm* — Cooper & Dunham LLP

(57) ABSTRACT

An optical device is disclosed, including a surface emitting laser element having a surface emitting laser which emits a light in a direction which is perpendicular to a substrate face; a light receiving element which monitors the light of the surface emitting laser; a package provided with a region on which the surface emitting laser element and the light receiving element are provided; and a lid which has a window through which passes the light of the surface emitting laser, the window being formed with a transparent member, and which covers the surface emitting laser element and the light receiving element.

19 Claims, 33 Drawing Sheets

(56) References Cited

FOREIGN PATENT DOCUMENTS

| JP | 2005-311185 | 11/2005 |
| JP | 2007-103576 | 4/2007 |
| JP | 2009-105240 | 5/2009 |
| JP | 2009-211004 | 9/2009 |
| JP | 2010-139406 | 6/2010 |
| JP | 2011-119496 | 6/2011 |
| JP | 2011-198857 | 10/2011 |

* cited by examiner

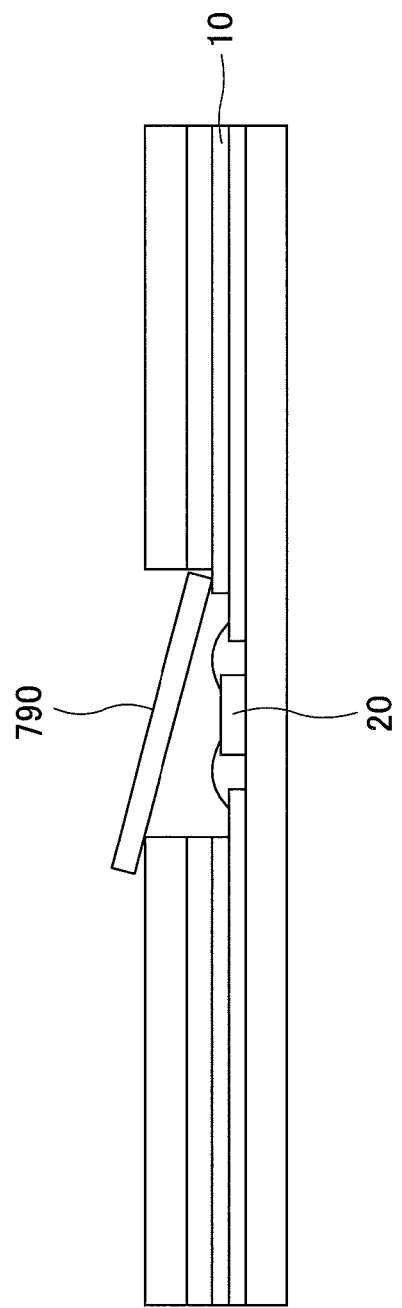

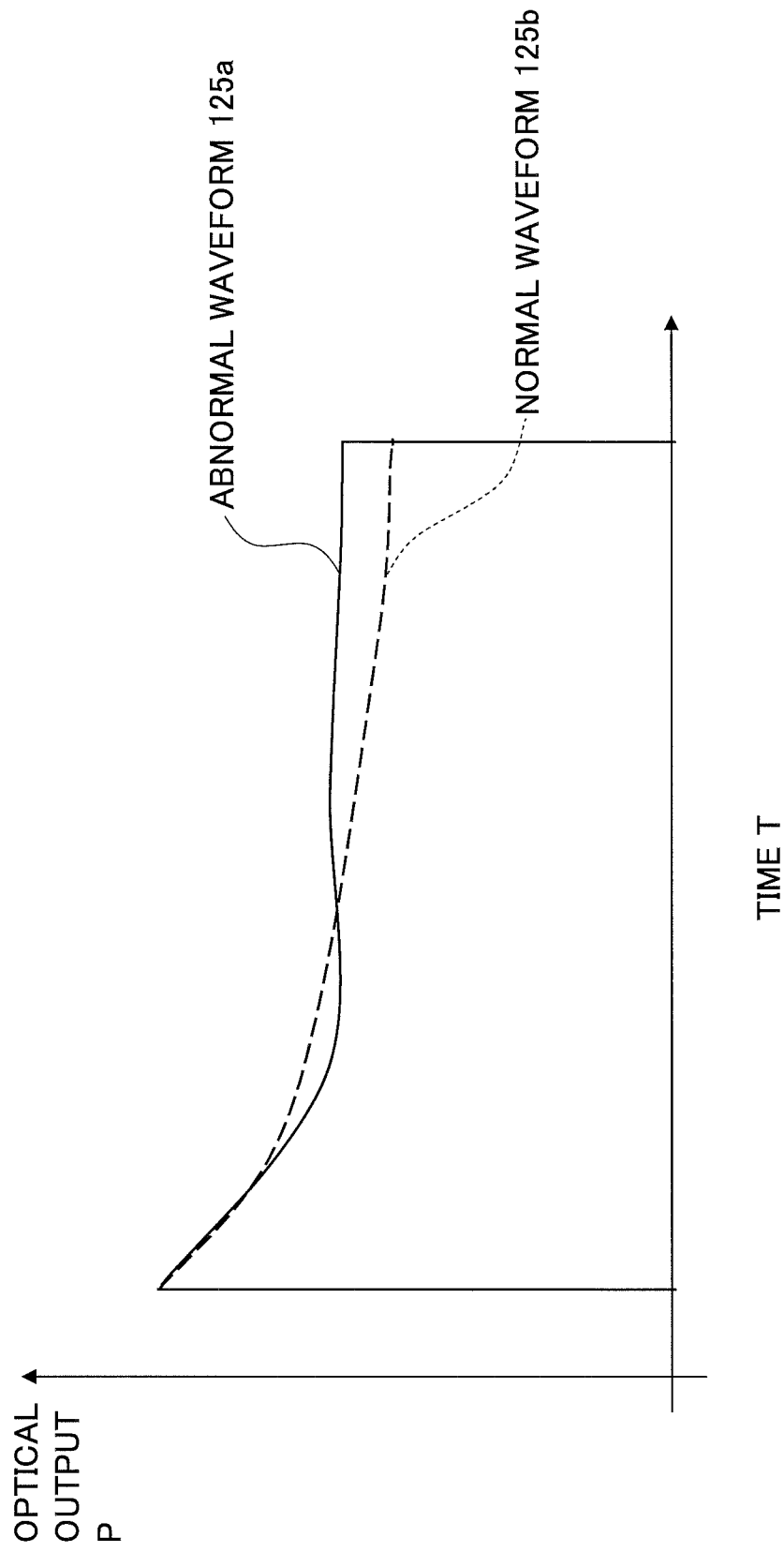

FIG.27
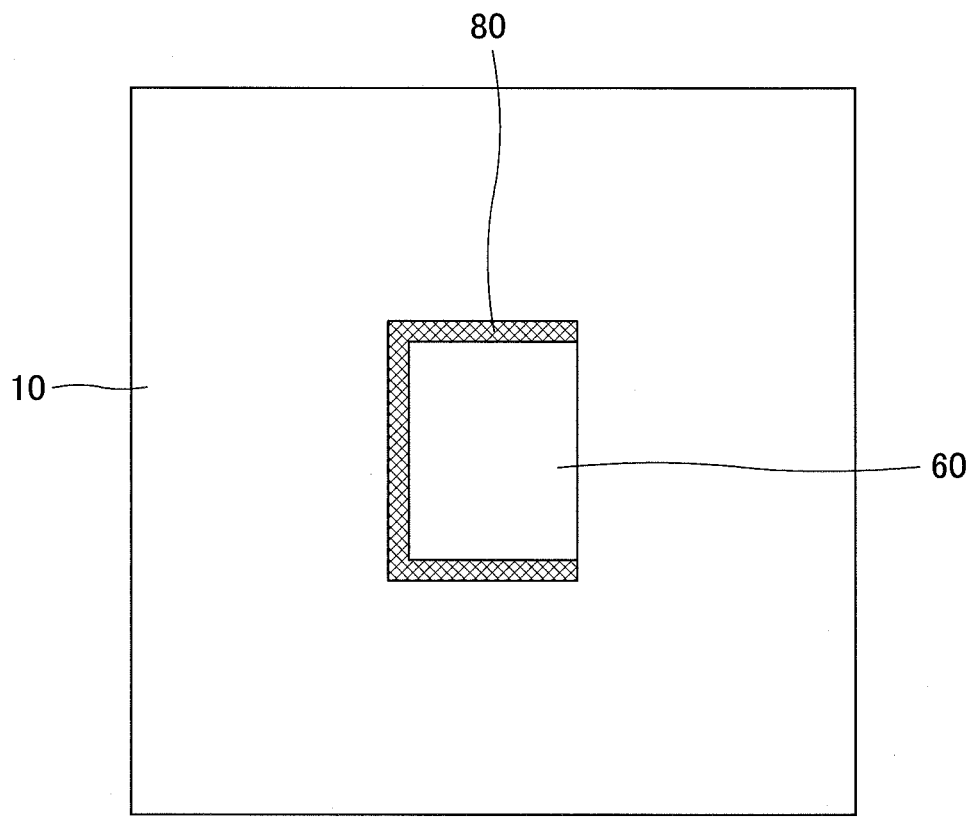
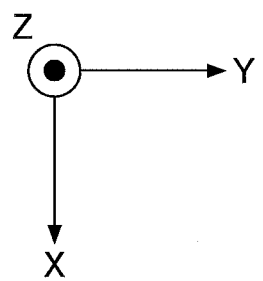

FIG.28
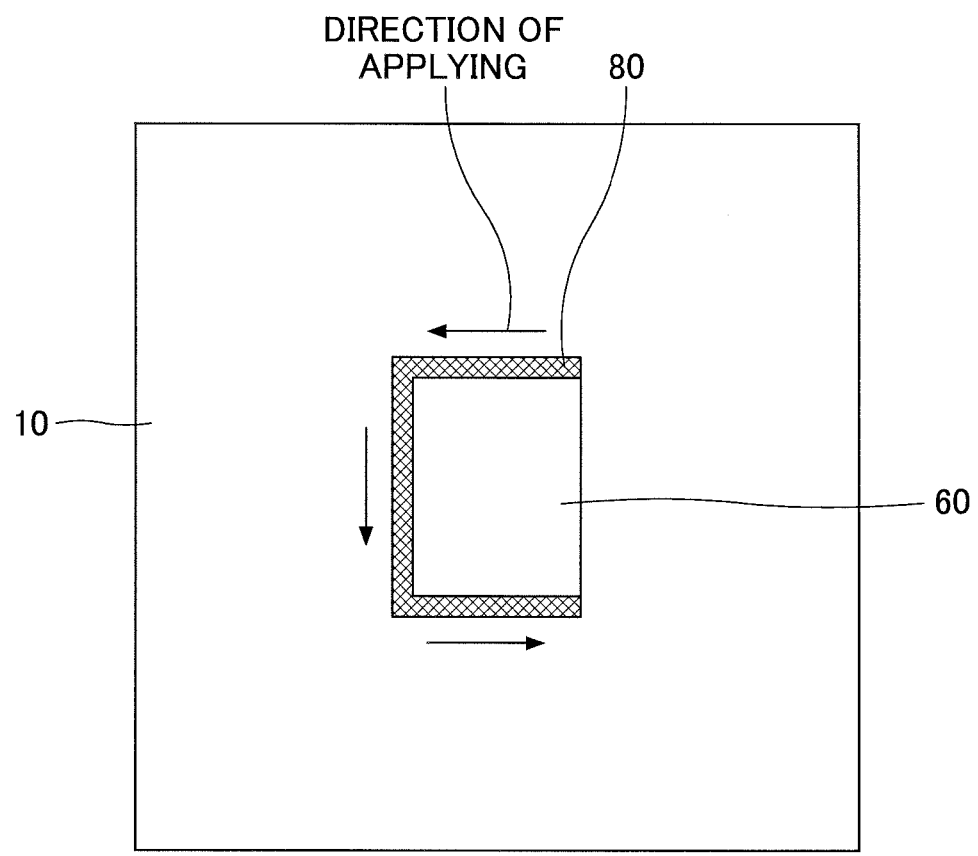
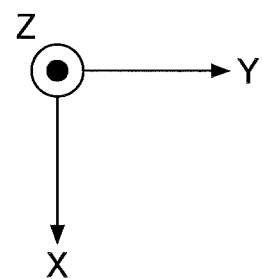

FIG.29
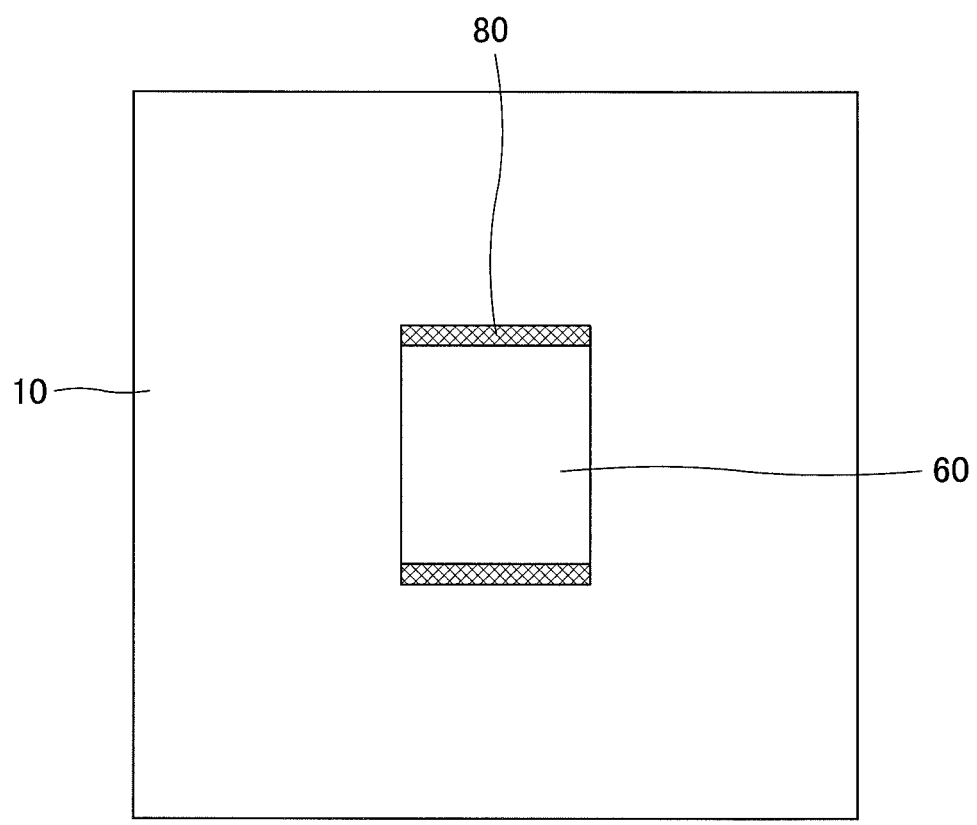
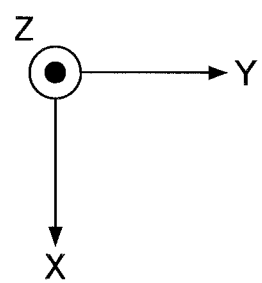

OPTICAL DEVICE, OPTICAL SCANNING APPARATUS, AND IMAGE FORMING APPARATUS

TECHNICAL FIELD

The present invention relates to optical devices, optical scanning apparatuses, and image forming apparatuses.

BACKGROUND ART

A surface emitting laser (VCSEL; vertical cavity surface emitting LASER) is a semiconductor laser which emits a light in a direction perpendicular to a substrate, has characteristics of lower cost and higher performance relative to an edge emitting laser, and ease of fabricating in arrays. Therefore, studies are being conducted on the VCSEL as a light source for optical communications such as optical interconnections, etc., a light source for an optical pickup, and a light source for an image forming apparatus such as a laser printer, etc., and some of them are being practically applied.

Now, an optical system generally having a semiconductor laser element, etc., including a surface emitting laser element has a problem that a change in a light amount occurs due to feedback light, wherein reflected light from a lens or glass returns to an original laser element. The above-described change in the light amount varies from what occurs at high speed on the order of nanoseconds (ns) to a change which occurs on the order of milliseconds (ms). In the related art, it is considered that the surface emitting laser is resistant to the feedback light since a reflectance of a mirror is high. However, as a result of studies, it has been confirmed that the surface emitting laser is not necessarily resistant to feedback light and that, in particular, in case of a surface emitting laser array in which multiple surface emitting lasers are aligned, light emitted from a certain surface emitting laser becomes the feedback light, which feedback light falls on a neighboring surface emitting laser, so that the change in the light amount occurs. Countermeasures for such feedback light are disclosed in Patent documents 1-3, for example.

Patent document 1 discloses a surface emitting laser, wherein a resonator is formed by a lower multilayer film reflecting mirror and an upper multilayer film reflecting mirror and a relaxation oscillation frequency at a bias point in the resonator is set to exceed an optical communication frequency which modulates a laser beam output from the surface emitting laser.

Moreover, Patent document 2 discloses a surface emitting semiconductor laser, including a semiconductor substrate, an active layer formed at an upper part of the semiconductor substrate, an emission face which is formed at an upper part of the active layer and which emits, in a direction perpendicular to the semiconductor substrate, a laser beam generated in the active layer, and an absorption layer which is provided on the emission surface and which partially absorbs the laser beam.

Furthermore, Patent document 3 discloses a surface emitting laser module for optical transmission, wherein at least a surface emitting laser chip and a monitoring photo detector are mounted on a TO header, the surface emitting laser module including a cap which includes a window coated with a film having a transmittance of no more than 40%.

Now, with the surface emitting laser, a laser beam may be taken out also from a direction opposite a direction of emission of the laser beam, so that the emitted light may be caused to fall on a light receiving element such as a photo diode, etc., to measure an output of the edge emitting laser, and control may be performed based thereupon to control a light amount of laser beams emitted from the edge emitting laser.

However, with the edge emitting laser, light may not be taken out from a face opposite the direction of emission of the laser beam from a structural viewpoint, so that some schemes to provide an optical system, etc., for monitoring the light amount, etc., are necessary.

Such schemes include a scheme in which, in a direction of emission of a laser beam of a surface emitting laser, the laser beam is reflected by a transparent member to be a window that is arranged in a tilted manner, and is caused to fall on a photo detector which is a light receiving element provided inside a surface emitting laser module, so that a light amount is monitored.

However, the above-described scheme has two problems. One is that interface reflectance at upper and lower faces of the transparent member to be the window is low on the order of 4-5%, so that, with such a degree of reflectance, current induced by light received at the light receiving element such as the photo diode, etc., is small and ends up getting buried in noise, etc. As a result, S/N ratio is low, so that it is not possible to accurately control the light amount of the surface emitting laser.

Another one is that, with an etalon effect due to reflection of light at the upper and lower faces of the transparent member to be the window, a change in the light amount occurs due to interference, so that the light amount cannot be monitored accurately. For example, Patent document 4 discloses a method of obtaining a monitor beam of a desired reflection intensity by providing a transparent member to be a window that is tilted, with a reflection control layer. However, while this method uses, as the monitor beam, a beam reflected at an interface of the upper face and the lower face at the transparent member to be the window, a change in a light amount occurs due to optical interference, so that it is not possible to detect the monitor beam in an accurate and stable manner. The same applies to Patent document 5.

Moreover, Patent document 10 discloses a scheme in which is provided a surface emitting laser module having a structure such that the etalon effect does not occur. This scheme provides a structure in which a reflective coating face made of metal is formed at a part of a transparent member to be a window, an emitted beam is reflected at the reflective coating face, and the reflected beam is caused to fall on a photo diode which is a light receiving element. With the above-described scheme, it is inferred that, since a reflectance of the emitted beam at the reflective coating face is high on the order of 50-60%, the beams which pass therethrough decrease and an effect of the etalon effect due to interference decreases. However, a region on which the reflective coating face is provided is around a light spot and a sufficient light amount as a monitor beam cannot be secured, so that a light amount cannot be monitored reliably. Moreover, in the region on which the reflective coating face is provided, the reflectance is high, so that the beams which pass therethrough decrease and a beam shape (a beam profile) of the light spot becomes non-uniform and a distribution of the light amount of the light spot of the beam emitted via the transparent member to be the window ends up becoming a distribution of a shape which deviates from a Gaussian distribution.

Thus, an object of the present invention is to provide an optical device which allows obtaining a monitor beam of a desired light amount without influencing a distribution of a light amount within a light spot, and an optical scanning apparatus and an image forming apparatus using the above-described optical device.

PATENT DOCUMENTS

Patent Document 1 JP2005-252032A
Patent Document 2 JP2005-86027A
Patent Document 3 JP2007-103576A
Patent Document 4 JP10-215020A
Patent Document 5 JP2009-105240A
Patent Document 6 JP2005-311185A
Patent Document 7 JP2002-319737A
Patent Document 8 JP2003-204111A
Patent Document 9 JP2009-211004A
Patent Document 10 JP9-198707A

DISCLOSURE OF THE INVENTION

According to an embodiment of the present invention, an optical device is provided, including a surface emitting laser element having a surface emitting laser which emits a light in a direction which is perpendicular to a substrate face; a light receiving element which monitors the light of the surface emitting laser; a package provided with a region on which the surface emitting laser element and the light receiving element are provided; and a lid which has a window which passes through the light of the surface emitting laser, the window being formed with a transparent member, and which covers the surface emitting laser and the light receiving element. At the transparent member, a reflecting film which partially reflects the light is provided on a face onto which the light from the surface emitting laser element falls, and a reflection preventing film which prevents reflection of the light is provided on a face which is opposite the face on which the reflecting film is provided. At the transparent member is provided at an angle which is tilted relative to the substrate face, and the lid is connected to the package such that the light emitted from the surface emitting laser is partially reflected at the reflecting film and falls on the light receiving element.

According to another embodiment of the present invention, an optical device is provided, including a surface emitting laser element having a surface emitting laser which emits a light in a direction which is perpendicular to a substrate face; a light receiving element which monitors the light of the surface emitting laser; a package provided with a region on which the surface emitting laser element and the light receiving element are provided; and a lid which has a window which passes through the light of the surface emitting laser, the window being formed with a transparent member, and which covers the surface emitting laser and the light receiving element. A reflection preventing film which prevents reflection of the light is provided on a face which is opposite a face on which a reflecting film is provided. The transparent member is provided at an angle which is tilted relative to the substrate face, and the lid is connected to the package such that the light emitted from the surface emitting laser is reflected due to a difference between a refractive index of the transparent member and a refractive index of air or gas in the air and falls on the light receiving element.

The embodiments of present invention makes it possible to provide an optical device which allows obtaining a monitor light of a desired light amount without influencing a distribution of a light amount within a light spot, and an optical scanning apparatus and an image forming apparatus which allow obtaining a high picture quality image using the above-described optical device.

BRIEF DESCRIPTION OF THE DRAWINGS

Other objects, features, and advantages of the present invention will become more apparent from the following detailed descriptions when read in conjunction with the accompanying drawings, in which:

FIG. 19 is a diagram which explains a structure of the surface emitting laser module for comparing with the first embodiment of the present invention;

FIGS. 20A and 20B are characteristic diagrams of an optical output in the surface emitting laser;

FIG. 27 is a first diagram for explaining a method of applying an adhesive;

FIG. 28 is a second diagram for explaining the method of applying the adhesive;

FIG. 29 is a diagram for explaining another method of applying the adhesive;

BEST MODE FOR CARRYING OUT THE INVENTION

Embodiments of the present invention are described. The same letters are assigned to the same members, etc., so that repeated explanations thereof are omitted.

First Embodiment

A first embodiment relates to a surface emitting laser module which has a surface emitting laser array which includes multiple surface emitting lasers. The surface emitting laser module according to the present embodiment is an optical device according to the present embodiment.

Figure 1:
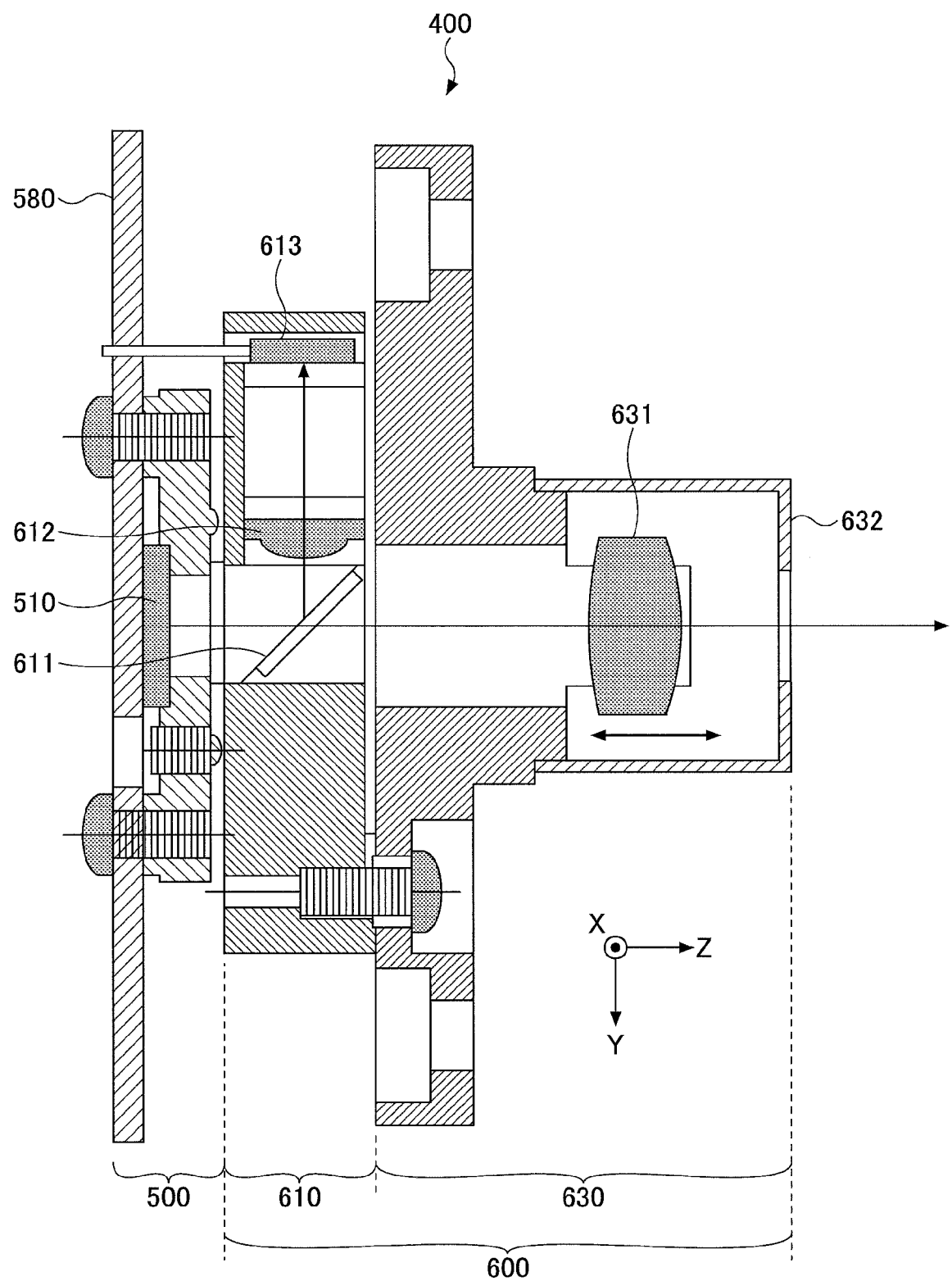
FIG. 1 is a configuration diagram of a light source unit which uses a surface emitting laser module.

Unlike a light source module using an edge emitting laser, a related art light source module using the surface emitting laser requires a monitoring optical system. In this way, a light source unit 400 which has the monitoring optical system includes a laser module 500 and an optical module 600 as shown in FIG. 1, for example.

The laser module 500 includes a surface emitting laser module 510, a laser control apparatus (not shown) which drives and controls the surface emitting laser module 510, and a PCB (printed circuit board) 580 on which is mounted the surface emitting laser module 510 and the laser control apparatus.

Moreover, the optical module 600 includes a first part 610 and a second part 630. The first part 610 includes a half mirror 611, a collective lens 612, and a photo diode 613. Furthermore, the second part 630 includes a coupling lens 631 and an opening plate 632.

The first part 610 is arranged such that the half mirror 611 is positioned on the +Z side of the surface emitting laser module 510 on an optical path of a beam emitted from a surface emitting laser array chip. A part of beams which is incident on the half mirror 611 is reflected in a −Y direction and received at the photo diode 613 via the collective lens 612. The photo diode 613, which is a monitoring photo diode, outputs, to a laser control apparatus of the laser module 500, a signal (photoelectrically converted signal) in accordance with a received light amount.

The second part 630 is arranged such that the coupling 631 is positioned on the +Z side of the first part 610 on an optical path of a beam which passes through the half mirror 611. The coupling 631 makes a beam which passed through the half mirror 611 a generally parallel beam. The opening plate 632, which has an opening, shapes a beam which passes through the coupling 631. A beam which passed through the opening of the opening plate 632 becomes a beam which is emitted from the light source unit 400.

However, a cost of incorporating the photo diode 613 for the monitoring into an optical system which introduces a laser beam is a cause for an increased price of the light source unit 400, which has led to the inventors having invented the surface emitting laser module according to the present embodiment.

(Surface Emitting Laser Module)

Figure 2:
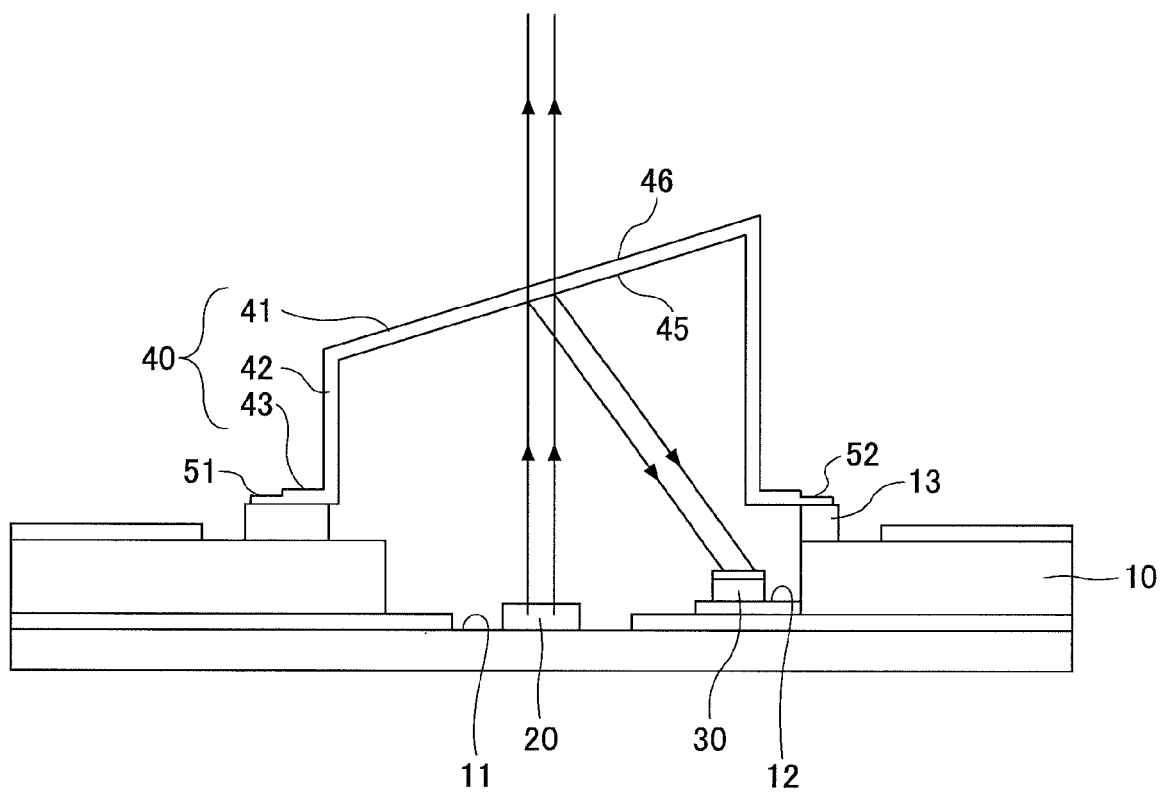
FIG. 2 is a structural diagram of the surface emitting laser module according to a first embodiment.
Figure 3:
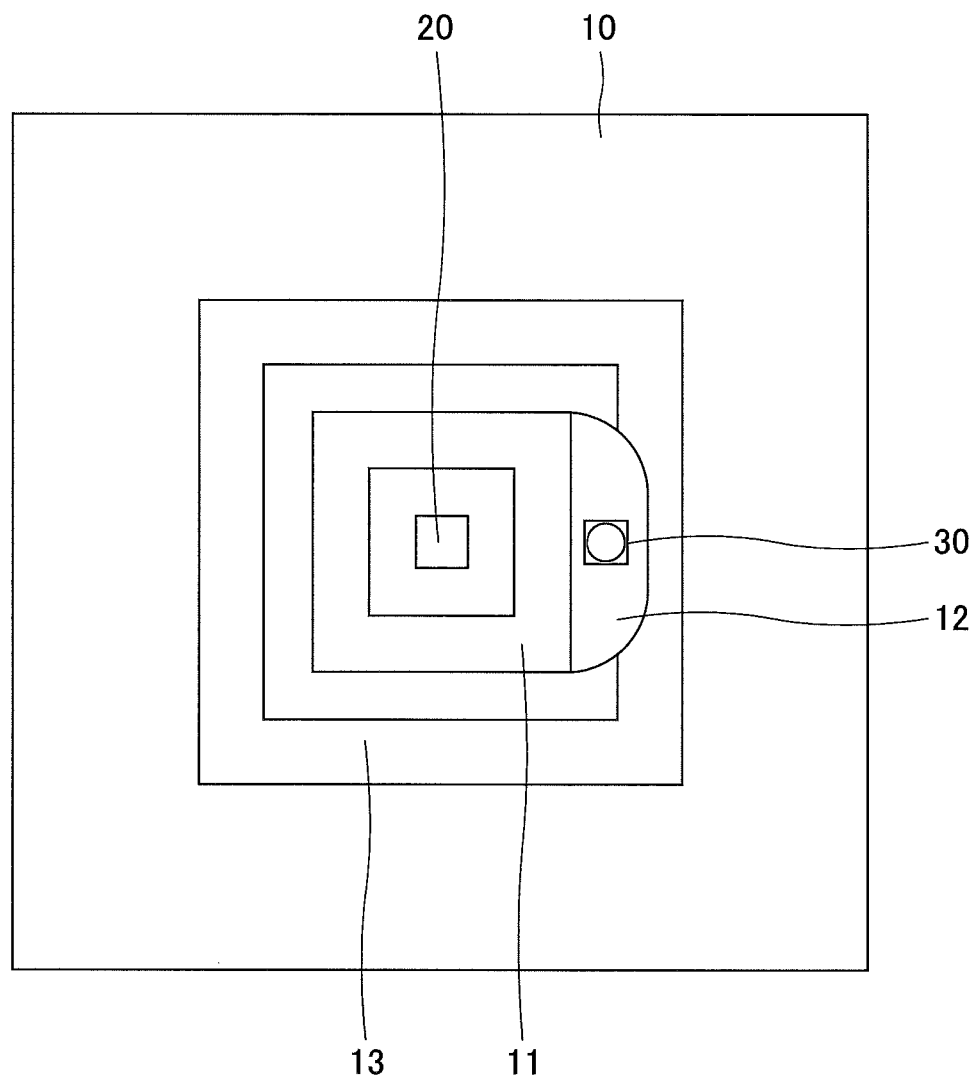
FIG. 3 is a front view of a package for use in the surface emitting laser module according to the first embodiment.

Based on FIGS. 2 and 3, the surface emitting laser module according to the present embodiment is described. The surface emitting laser module according to the present embodiment includes a package 10 which has a concave section, a surface emitting laser element 20, a photo diode 30 for monitoring, and a lid 40 which is formed with a transparent material (a transparent member). In the surface emitting laser element 20, which is also called a surface emitting laser array chip, multiple surface emitting lasers are formed in an array shape.

The surface emitting laser element 20 is provided on a bottom face 11 of the concave section of the package 10, and the photo diode 30 for monitoring is provided at a stage 12 which is located within the concave portion and which is higher than the bottom face 11. Moreover, in the package 10 is provided a package connecting section 13 for connecting to the lid 40.

The package 10 is a so-called flat package which is called a CLCC (ceramic leaded chip carrier) formed of ceramics. The package 10, which has a concave section, has a multi-layered structure of metal wirings to be multiple lead wirings (not shown) and ceramics. The package 10 may also be formed of a non-ceramic material, e.g., a resin material.

The lead wiring, which is shaped such that it radially extends outward from a region on which the surface emitting laser element 20 is provided, is connected to an electrode terminal (not shown) outside the package 10 via a metal wiring inside the package 10.

Moreover, a metal film is provided in a region in which the surface emitting laser element 20 is provided, which metal film is also called a die attach area and is a common electrode. The surface emitting laser element 20 is die bonded using a soldering material such as AuSn, etc., on the metal film. In this way, the surface emitting laser element 20 is provided on the bottom face of the concave section.

Moreover, the photo diode 30 is die bonded at the stage 12, an anode electrode of the photo diode 30 and a metal wiring of the package 10 are electrically connected by wire bonding, and a cathode of the photo diode 30 that is formed on a back face is grounded by a conductive adhesive.

On the other hand, the lid 40, which is formed in a concave shape, is provided with a transparent member of a window 41 through which passes a beam from the surface emitting laser element 20. Moreover, the lid 40 includes a tube-shaped section 42 which is connected to the transparent member of the window 41 and a lid connecting section 43 which has a structure such that an edge of the tube-shaped section 42 is bent. The lid connecting section 43 is for connecting to the packaging connecting section 13 in the package 10. The lid 40 is formed by being molded integrally with a resin material through which passes a beam. The transparent member of the window 41 is formed such that it has a predetermined tilt relative to a face which is perpendicular to a beam emitted from the surface emitting laser, so that the beam emitted from the surface emitting laser of the surface emitting laser element 20 does not return to the surface emitting laser which emitted the beam. The tilt angle is formed to be a certain angle such that, of beams emitted from the surface emitting laser, a reflected beam which is reflected at the transparent member of the window 41 falls on the photo diode 30. More specifically, in the present embodiment, it is arranged for the tilt angle to be approximately 17 degrees. Moreover, the reflectance at a surface of the resin material which forms the lid 40 is approximately 5.2%.

The package 10 and the lid 40 are connected by an adhesive, etc., at the package connecting section 13 and the lid connecting section 43. The surface emitting laser module according to the present embodiment includes a region 51 such that the package connecting section 13 and the lid connecting section 43 are connected by the adhesive, etc., and a region 52 where they are not connected. In this way, the region 52 such that the package connecting section 13 and the lid connecting section 43 are not connected may be provided to drain moisture such as water content, etc., via the region 52. In other words, if the package connecting section 13 and the lid connecting section 43 are completely connected, a drastic temperature change may occur due to water content which has entered via the adhesive, etc., inside the surface emitting laser module surrounded by the package 10 and the lid 40. In this case, condensate could form within the surface emitting laser module. The surface emitting laser module at which such condensate forms could become fatally damaged.

In the present embodiment, as shown in FIG. 2, the lid 40 may be integrally made by molding with a transparent resin material and the lid 40 and the package 10 may be connected by adhering them with an adhesive to form a surface emitting laser module at low cost. Moreover, the region 52 is provided such that the lid connecting section 43 and the package connecting section 13 are not connected in order to avoid water content having entered inside the surface emitting laser module via an adhesive forming condensate, as the adhesive is used for adhering. Such a region 52 may be provided to drain water content from inside the surface emitting laser module via the region 52.

In the present invention, this region 52 is also called a water content transmitting region. The water content transmitting region may allow water content to pass through without letting dust, etc., enter thereinto. More specifically, in the present embodiment, the package 10 is formed of ceramics. When surface roughness of the package 10 was measured in a 10 μm square range by a non-contact three-dimensional measurement apparatus NH-3SP (Mitaka Kouki, Co., Ltd.), it was approximately 2 μm. Supposing that a face at the lid connecting section 43 of the lid 40 is generally flat, so that only a gap on the order of a surface roughness of the package 10, or an opening of no more than 2 μm is formed in the region 52, the water content may be drained without letting dust, etc., of a size exceeding 2 μm entering thereinto. Thus, it is arranged to be a suitable structure as a water content transmitting region. While the surface roughness of the package 10 differs in accordance with a method of manufacturing the package 10, or a ceramics material which makes up the package, it is preferred that the surface roughness is between 1 μm and 2 μm in order to obtain stable laser oscillation with a small light amount change in the surface emitting laser module.

Figure 4:
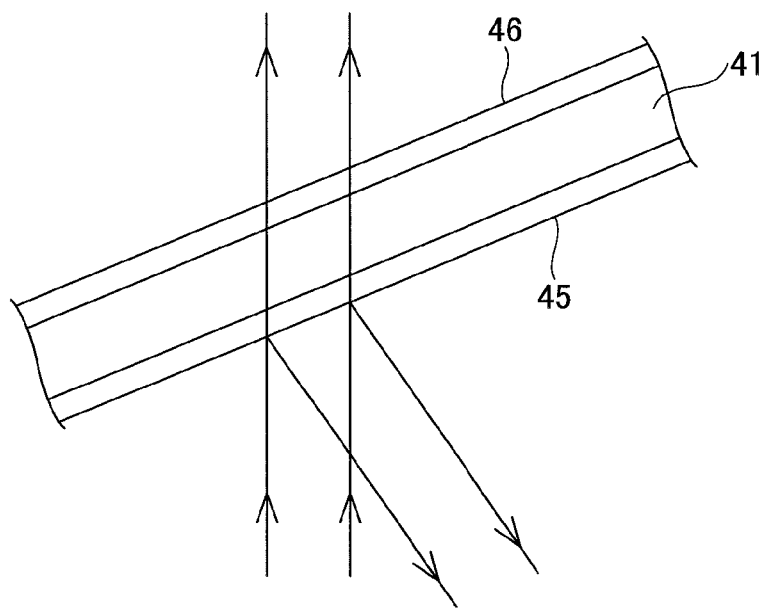
FIG. 4 is an expanded feature diagram of the surface emitting laser module according to the first embodiment.

Moreover, the surface emitting laser module according to the present invention is arranged such that, as shown in FIGS. 2 and 4, a reflecting film 45 is formed on a face (a lower face) inside the transparent member of the window 41 and a reflection preventing film 46 is formed on a face (an upper face) outside thereof. In this way, a beam emitted from the surface emitting laser element 20 may be reflected at a high reflectance to cause the beam to be incident on the photo diode 30. In this way, a beam with a sufficient light amount as a monitor beam may be caused to be incident on the photo diode 30, and the reflection preventing film 46 may be provided on the upper face to decrease an interface reflection on the upper face to decrease an influence of the etalon effect.

Figure 5:
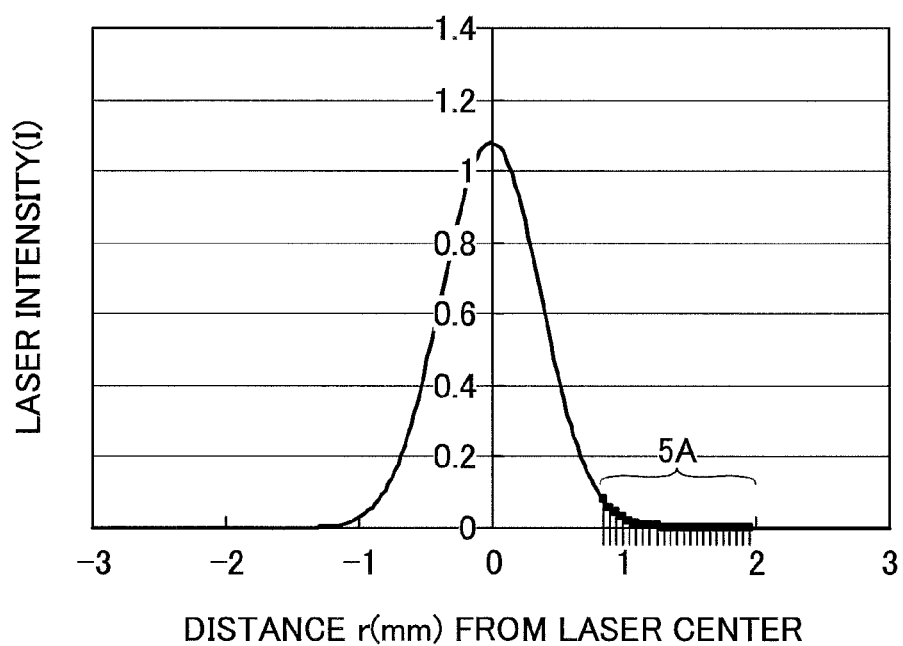
FIG. 5 is a light amount distribution diagram of a light spot for a related art surface emitting laser module.

In other words, with the scheme disclosed in Patent document 10, as shown in FIG. 5, as a beam in a region 5A which is distant from a center of a laser beam is reflected, a light amount is small, so that a sufficient light amount as a monitor beam may not be obtained, and reliability of monitoring of the light amount becomes low. Moreover, in the region 5A, as the reflectance is high on the order of magnitude 50-60%, a light amount having passed through is decreased, so that distribution of the light amount of a light spot becomes non-uniform.

Figure 6:
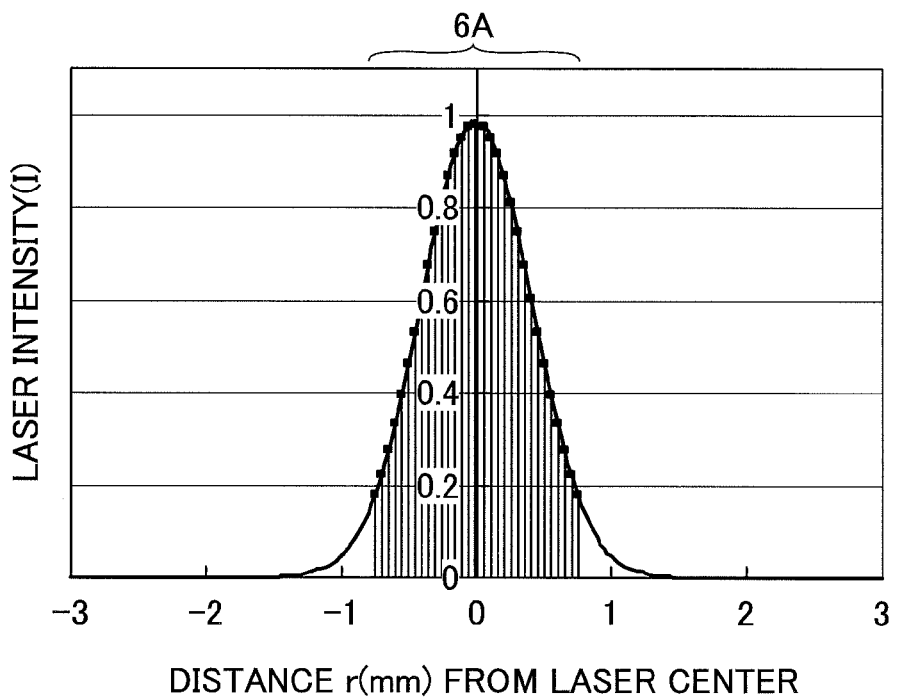
FIG. 6 is a light amount distribution diagram of a light spot of the surface emitting laser module according to the first embodiment.
Figure 7:
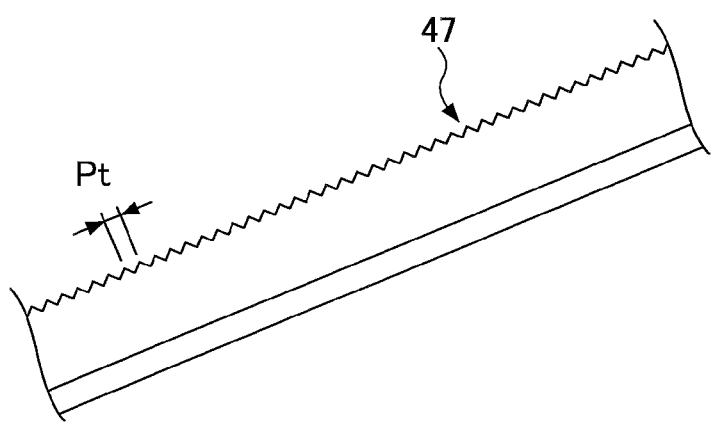
FIG. 7 is an expanded feature diagram of another surface emitting laser module according to the first embodiment.

However, in the present embodiment, as shown in FIG. 6, a beam of a higher light amount part of a light spot is reflected, so that a sufficient light amount as a monitor beam may be obtained, and there is no influence on a distribution of a light amount of the light spot. In the present embodiment, the reflectance is preferably 3-15% and more preferably 5-12%. This is because, when the reflectance is too low, as a monitor current becomes low, a signal detected at the photo diode 30 is buried in noise, and S/N decreases, so that it is no longer possible to accurately control a light amount of a surface emitting laser at the surface emitting laser element 20. Moreover, this is because, when the reflectance is too high, an amount of loss of a laser beam emitted from the surface emitting laser becomes high, so that a light amount of a laser beam emitted outside the surface emitting laser module ends up decreasing.

From these viewpoints, considering reflection at a lower part of a transparent member, further suitable results are produced if the reflection of the very material may be used that uses the difference between the refractive index of the transparent member and the refractive index of a space or a gas in the space without providing a reflection layer in a lower part, in case the reflectance falls within a scope of the above-described desirable reflectance. In other words, reflection which uses the refractive index of the material itself may eliminate variations in thin film fabrication and may lead to obtaining a stable monitor current. Moreover, a need to form the reflection layer is eliminated, so that the cost thereof becomes inexpensive as a matter of course.

Moreover, it is preferable that the reflection preventing film 46 is no more than 1%, and is more preferable that it is no more than 0.5%. In this way, a part of beams in the region 6A in FIG. 6 may be reflected to cause the reflected beam to be incident on the photo diode 30.

The reflection film 45 is formed of a metal film made of gold, etc., that through which light passes at a predetermined transmittance, or a mirror which includes a dielectric multilayer film. The dielectric multilayer film is formed by alternately laminating a high refractive material and a low refractive material of a predetermined thickness. A material with a high refractive index includes $ZnS-SiO_2$, $TiO_2$, etc., while a material with a low refractive index includes $SiO_2$, etc. Moreover, the reflection preventing film 46 is formed of a dielectric film which has a refractive index which is lower than a refractive index of the transparent member of the window 41, or a dielectric multilayer film, wherein a high refractive material and a low refractive material of a predetermined film thickness are laminate formed in an alternate manner.

Moreover, the above-described reflection preventing film 46 may be replaced with one having a structure in which a concave-convex section 47 is formed on an upper face of a transparent member of the window 41. More specifically, in order for the concave-convex section 47 to be formed on the upper face of the transparent member of the window 41 when forming the lid 40, a die having a concave and convex shape may be used and a resin material may be poured on the die to form the concave-convex section 47. Here, a pitch Pt of the concave-convex section 47 is less than the wavelength of a beam emitted from the surface emitting laser element 20, or between 50 nm and 500 nm. Such a concave-convex section 47 may be provided to decrease beams in a direction which is perpendicular to the face of the transparent member of the window 41 due to scattering, etc., of beams at an interface of the concave-convex section 47 and to prevent the etalon effect.

Figure 8:
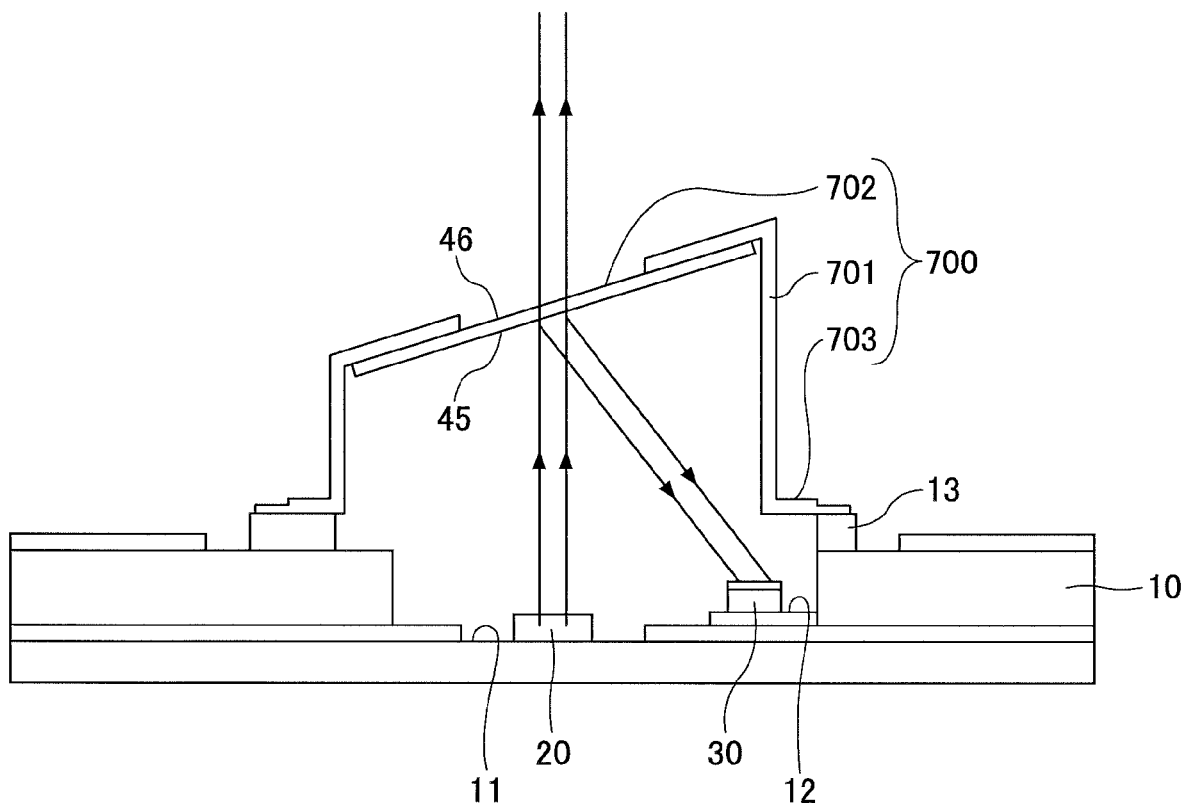
FIG. 8 is a first structural diagram of the other surface emitting laser module according to the first embodiment.

Now, in order to prevent water content from entering into the surface emitting laser module, a method may be considered which joins the package 10 and a lid 700 made of metal as shown in FIG. 8 by welding. In the lid 700 made of metal, a cover glass 702 is provided on one side of a lid body 701 which is formed of metal and which is tube shaped, while a lid connecting section 703 which is bent is provided on the other side of the lid body 701. The lid 700 made of metal and the package 10 may be completely joined by welding at the lid connecting section 703 and the packaging connection section 13 to prevent water content, etc., to enter from outside. Here, the reflecting film 45 may be provided on a lower face of the cover glass 702 which is a transparent member to be a window and the reflection prevention film 46 may be provided on the upper face. In this case, while not shown, the reflection preventing film 46 may be replaced with what is provided with a concave-convex section made by surface processing an upper face of the cover glass 702.

Figure 9:
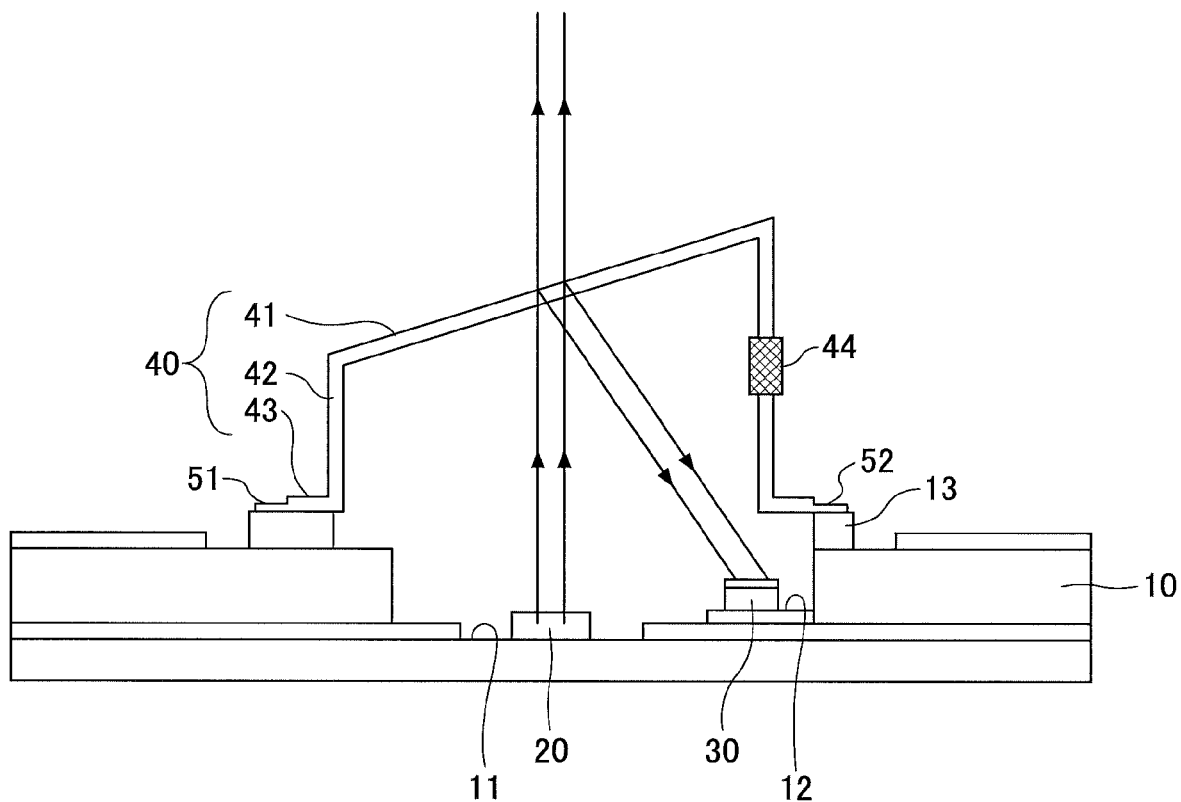
FIG. 9 is a second structural diagram of the other surface emitting laser module according to the first embodiment.

Moreover, the present embodiment, as shown in FIG. 9, may be configured to provide a water content transmitting section 44 to be a water content transmitting region at a part of the tube shaped section 42 of the lid 40. The water content transmitting section 44 is formed of a filter such as a mesh, etc., having an opening of no more than 2 μm, or a moisture transmitting waterproof material such as Gore-Tex (manufactured by W. L. Gore and Associates, Inc.). For example, the above-described filter is formed with a mesh having an opening between 1 μm and 2 μm. When using such a lid 40, adhering may be done with a resin material so that there is no region in which connection is not made between the package connecting section 13 and the lid connecting section 43 and there are only regions 51 in which the package connecting section 13 and the lid connecting section 43 are connected by an adhesive, etc.

According to the above, a water content transmitting area may be provided between the package 10 and the lid 40 and a water content transmitting section 44 to be a water content transmitting region having a water transmitting and adjusting function may be provided at the lid 40 to effectively drain, to the outside, water content which entered inside and to prevent condensation from occurring due to drastic temperature changes. Moreover, while optical chacteristics could change when dust such as refuse, etc., of no less than 2 μm enters inside the surface emitting laser module, the present embodiment makes it possible to prevent the dust such as the refuse, of no less than 2 μm from entering while transmitting the water content. Thus, the surface emitting laser module according to the present embodiment makes it possible to perform a stable laser oscillation with a small change of a light amount.

Figure 10:
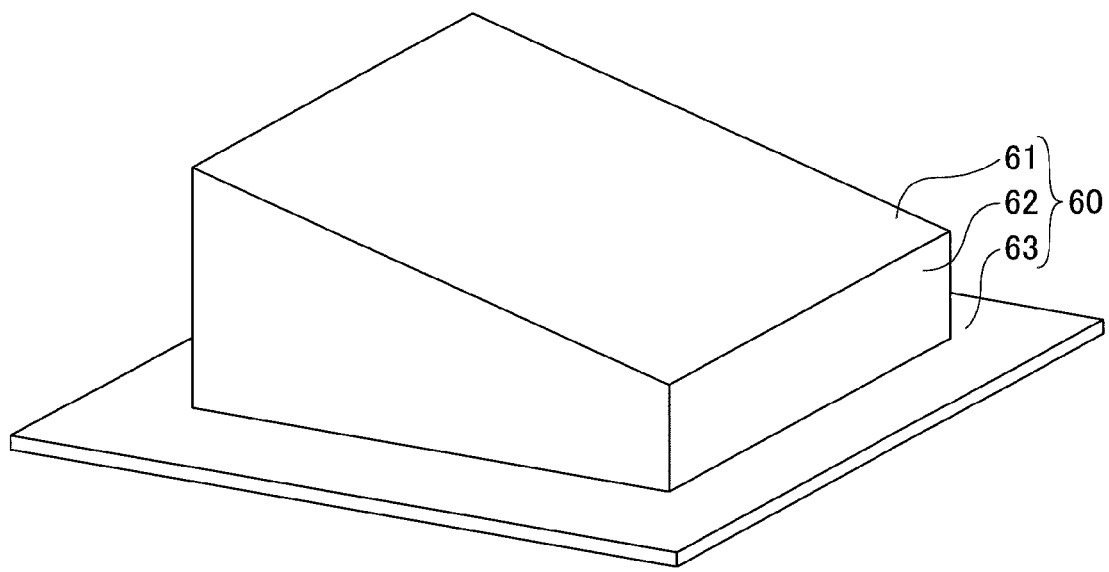
FIG. 10 is a first structural diagram of another lid for use in the surface emitting laser module according to the first embodiment.

Moreover, while a case of using a cylindrically shaped lid 40 has been described, the lid may be square column shaped. For example, as shown in FIG. 10, it may be a lid 60 having a quadrilateral tube shape. The lid 60 includes a transparent member as a window 61 which is tilted, a tube shaped section 62 having a quadrilateral tube shape, and a lid connecting section 63 having a quadrilateral shape. In such a lid 60, the lid connecting section 63 is arranged to have regions such that three of four sides of the lid connecting section 63 have an adhesive applied and such the remaining side does not have the adhesive applied, so that the region in which the adhesive is not applied on the remaining side becomes a water content transmitting region.

Figure 11:
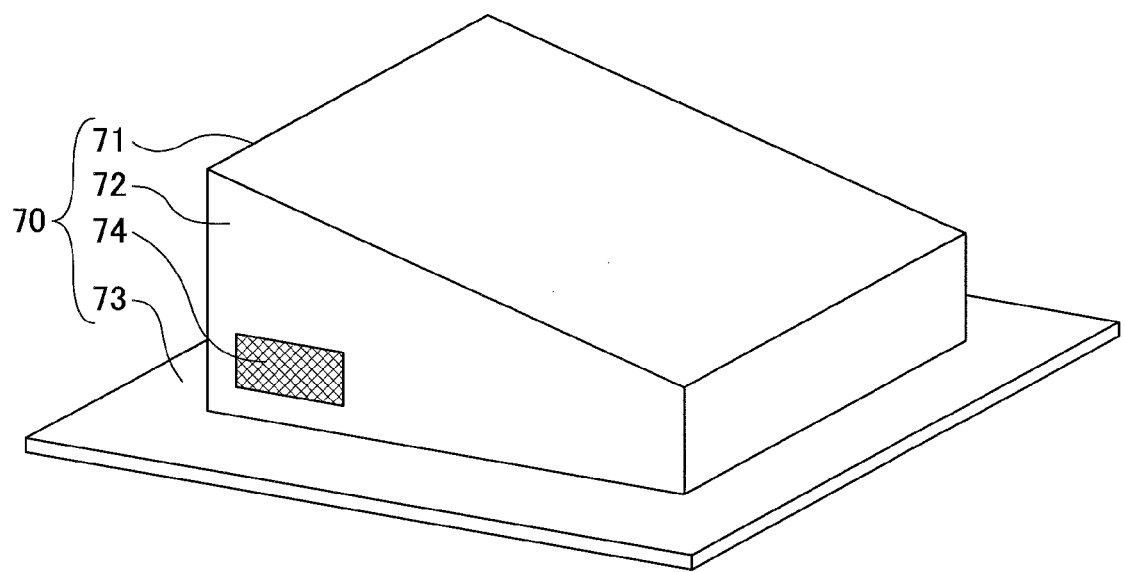
FIG. 11 is a second structural diagram of the other lid for use in the surface emitting laser module according to the first embodiment.

Moreover, for example, as shown in FIG. 11, it may be a lid 70 having a quadrilateral tube shape. The lid 70 includes a transparent member as a window 71 which is tilted, a quadrilateral tube shaped section 72, and a quadrilateral shaped lid connecting section 73, wherein the tube shaped section 72 is provided with a water content transmitting section 74 as a water content transmitting region. In the lid 70, it is also possible to apply the adhesive on all four sides of the lid connecting section 73 so as to adhere the package therewith.

When high temperature and high moisture testing was performed at 85° C. and 85% in the surface emitting laser module of the present embodiment with a structure shown in FIG. 2, it was confirmed that condensation did not occur. On the other hand, for the package connecting section 10 and the lid connecting section 43 which are adhered with an adhesive on all faces without providing a region 52 which is not connected by the adhesive, when the high temperature and high moisture testing was performed at 85° C. and 85%, it was confirmed that condensation occurred around the time when approximately 10 hours had elapsed.

As an adhesive for adhering the package connecting section 13 and the lid connecting section 43, an epoxy adhesive or an acrylic adhesive, which is inexpensive, may be used. Moreover, in FIGS. 2, 3, 8, and 9, wire bonding for connecting the surface emitting laser element 20 and the package 10 is omitted.

Furthermore, while the lid 40 according to the present embodiment is formed with a transparent resin material, such a resin material needs to be a material which transmits a beam emitted from the surface emitting laser. As such a material, a methacrylate resin (PMMA: poly methacrylate) as shown in CHEM 1 below, is suitable. PMMA, which is an acrylic ester polymer or a methacrylic ester polymer, is a highly transparent and highly amorphous synthetic resin. Its features include being most transparent of plastics and having the best optical characteristics of the plastics. Moreover, weatherability, appearance, surface gloss, and surface hardness are also favorable. Furthermore, it is an advantage that heating and softening do not cause whitening.

CHEM1

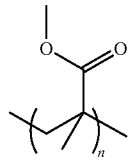

Moreover, another transparent resin material includes a cyclic olefin copolymer (COC) resin, which is shown in CHEM 2 below. The COC, which is an amorphous transparent resin having a cyclic olefin structure, is a resin having superior performance such as high dimensional stability which comes from low water absorptivity, high heat resistance which is at least equivalent to polycarbonate (PC), optical properties which are equivalent to PMMA, etc. Furthermore, it is also very favorable in vapor barrier properties, rigidity, and heat resistance. Moreover, a further transparent resin material includes polyester resin, etc.

CHEM 2

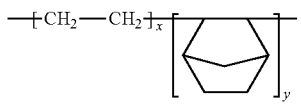

(Surface Emitting Laser)

Next, a surface emitting laser which is formed in a surface emitting laser array chip which is the surface emitting laser element 20 is described. The surface emitting laser array is arranged such that multiple surface emitting lasers are two dimensionally aligned in an array shape, and such a surface emitting laser array is made into one chip as a surface emitting laser array chip.

Figure 12A:
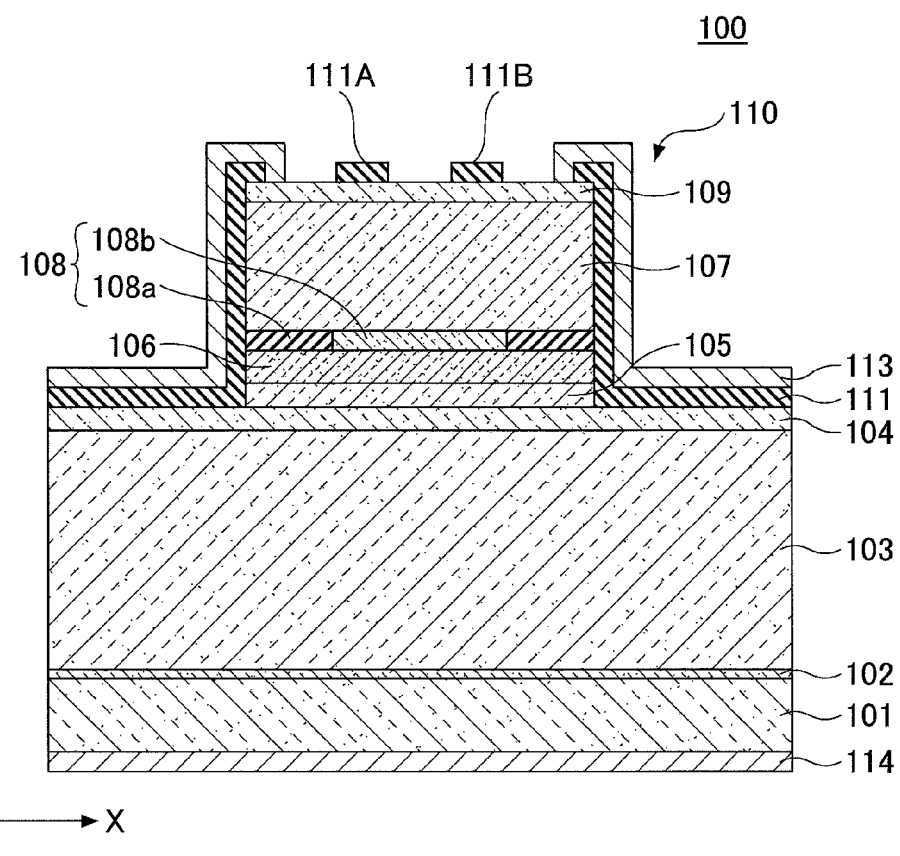
FIGS. 12A and 12B are configuration diagrams of a surface emitting laser according to the first embodiment.
Figure 12B:
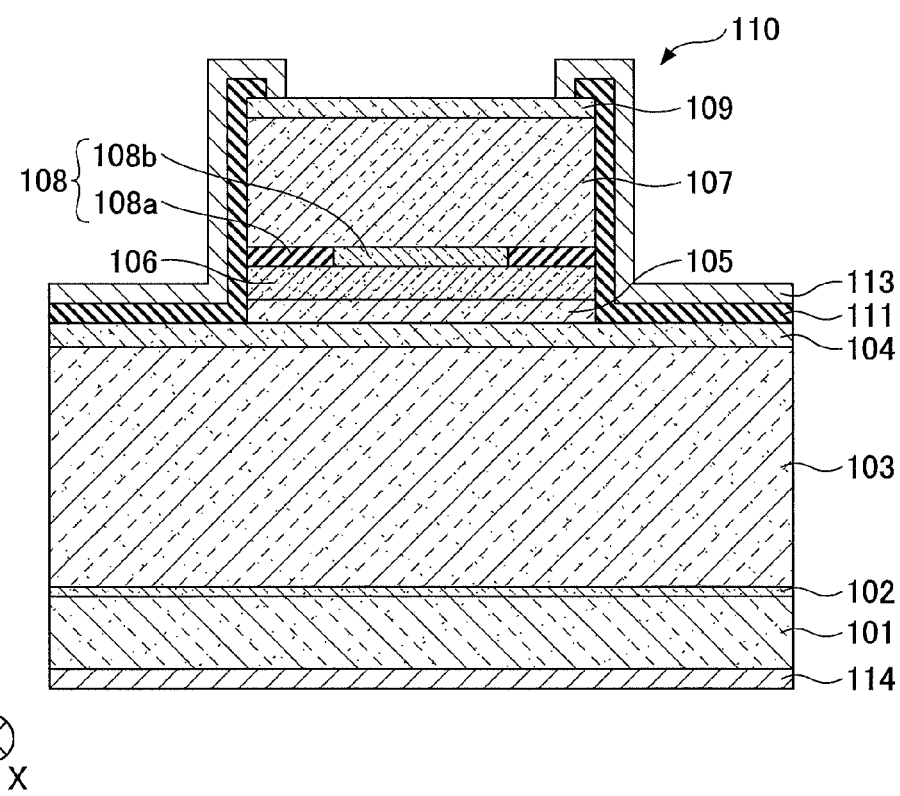

Based on FIGS. 12A and 12B, one surface emitting laser 100, plural of which make up the surface emitting laser array, is described. FIG. 12A is a cross-sectional diagram in an XZ plane of the surface emitting laser 100, while FIG. 12B is a cross-sectional diagram in a YZ plane of the surface emitting laser 100. Moreover, as described above, it is described herein with a laser oscillating direction as a Z-axis direction, and two directions orthogonal to each other within a plane perpendicular to the Z-axis direction as X-axis and Y-axis directions.

A surface emitting laser 100, which is a surface emitting laser with an oscillation wavelength in the 780 nm band, includes a substrate 101, a buffer layer 102, a lower semiconductor DBR 103, a lower spacer layer 104, an active layer 105, an upper spacer layer 106, an upper semiconductor DBR 107, a contact layer 109, etc. Moreover, a mesa 110 is formed at a part of the lower spacer layer 104, the contact layer 109, the upper semiconductor DBR 107, the upper spacer layer 106, and the active layer 105, a p-side electrode 113 is formed at an upper part of the mesa 110, and an n-side electrode 114 is formed on a back face of the substrate 101. Furthermore, a protective layer 111 is formed and transparent layers 111A and 111B are formed when the protective layer 111 is formed.

As shown in FIGS. 12A and 12B, a current blocking layer 108 of p-AlAs is formed with a thickness of 30 nm in one of low refractive layers in the upper semiconductor DBR 107. A position of inserting this current blocking layer 108 is a position corresponding to a third node from the active layer 105 in a standing wave distribution of an electric field. For the current blocking layer 108, the mesa 110 is formed and then a thermal oxidation, etc., are performed, so that a selectively oxidized region 108a and a current blocking region 108b are formed.

Here, a surface emitting laser module shown in FIG. 8 is described in more detail. For the surface emitting laser module shown in FIG. 8, the surface emitting laser element 20, which is a multi-channel surface emitting laser array with at least 10 channels (a surface emitting laser array having at least 10 surface emitting lasers), is housed in an integrated package 10, together with the photo diode 30. In order to prevent dust from entering, the package 10 is covered with a lid 700, wherein a lid body 701 is provided with a cover glass 702 as a transparent member.

The cover glass 702 as the transparent member is arranged such that it is tilted relative to an optical axis of the surface emitting laser. One of the reasons for arranging in a tilted manner is to prevent feedback light due to reflection from the cover glass 702, which is the transparent member, from entering into a laser emission outlet and preventing optical changes in surface emitting laser beams. Moreover, as another reason, the surface emitting laser element 20 is installed on the bottom face 11 of the package 10, so that a beam emitted from a surface emitting laser at the surface emitting laser element 20 passes through the cover glass 701, which is the transparent member, and is emitted out of the surface emitting laser module. Here, the cover glass 702 is arranged in a tilted manner such that portions of laser beams emitted from the surface emitting laser are reflected on a front face or a back face of the cover glass 701, and the reflected beams are incident on the photo diode 30. In other words, it is arranged such that beams reflected at the cover glass 702 become monitor beams.

However, when using the beams reflected at the cover glass 702 as the monitor beams, there is a problem as described above that the etalon effect occurs due to interference of reflected beams at the front and back faces of the cover glass 702. The etalon effect is a phenomenon such that multiple reflections occur in accordance with a distance between parallel upper and lower faces of the transparent member, which multiple reflections become light interference in accordance with frequency, so that a sinusoidal wave relative to a wavelength is drawn. More specifically, based on experience of the present inventors, for example, with more channels, frequency change due to temperature is remarkable in a multi-channel surface emitting laser array of at least 10 channels, thereby causing a swing in a monitor beam source intensity and an inability to detect a linear monitor current.

Figure 13:
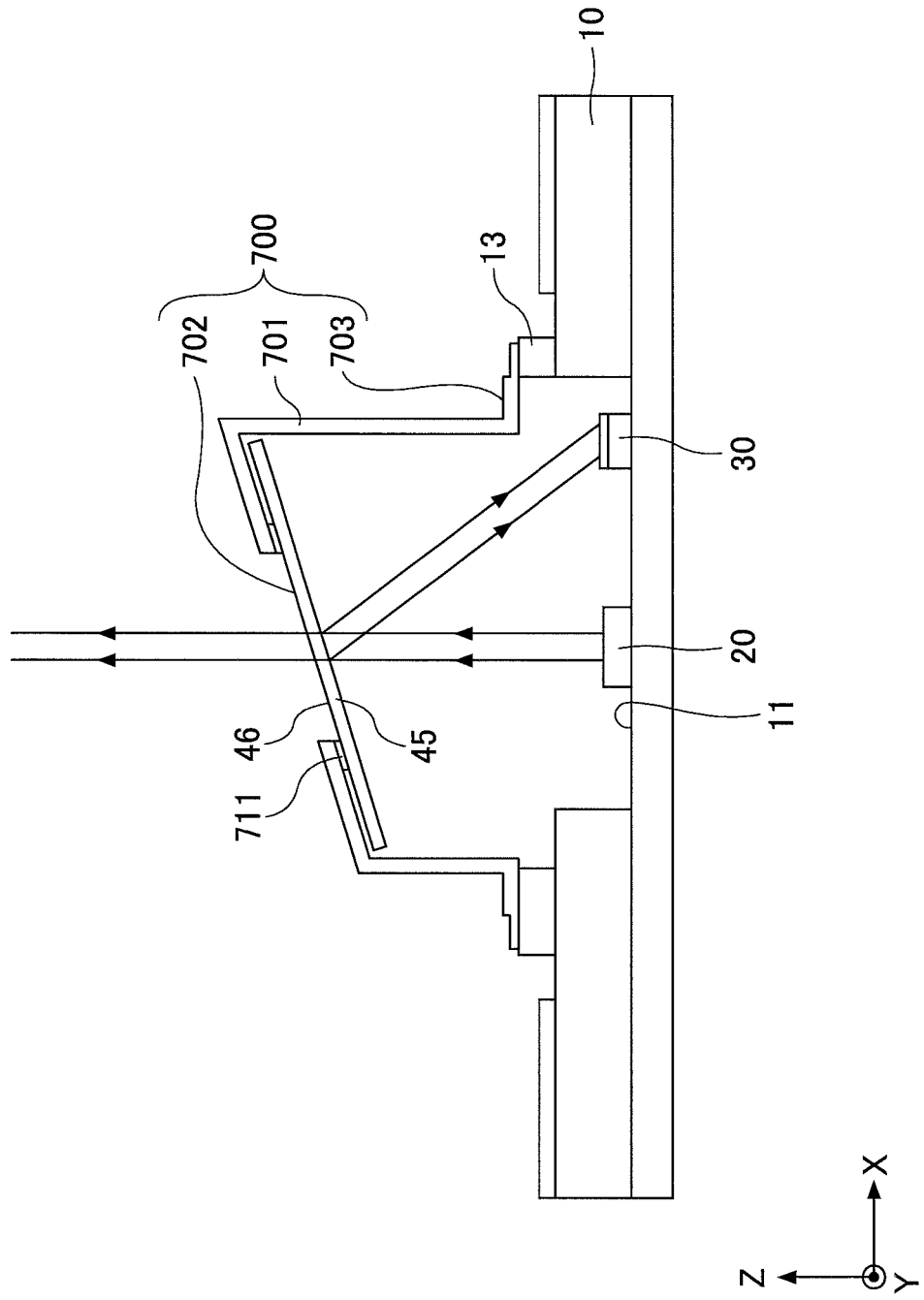
FIG. 13 is a third structural diagram of the other surface emitting laser module according to the first embodiment.
Figure 14:
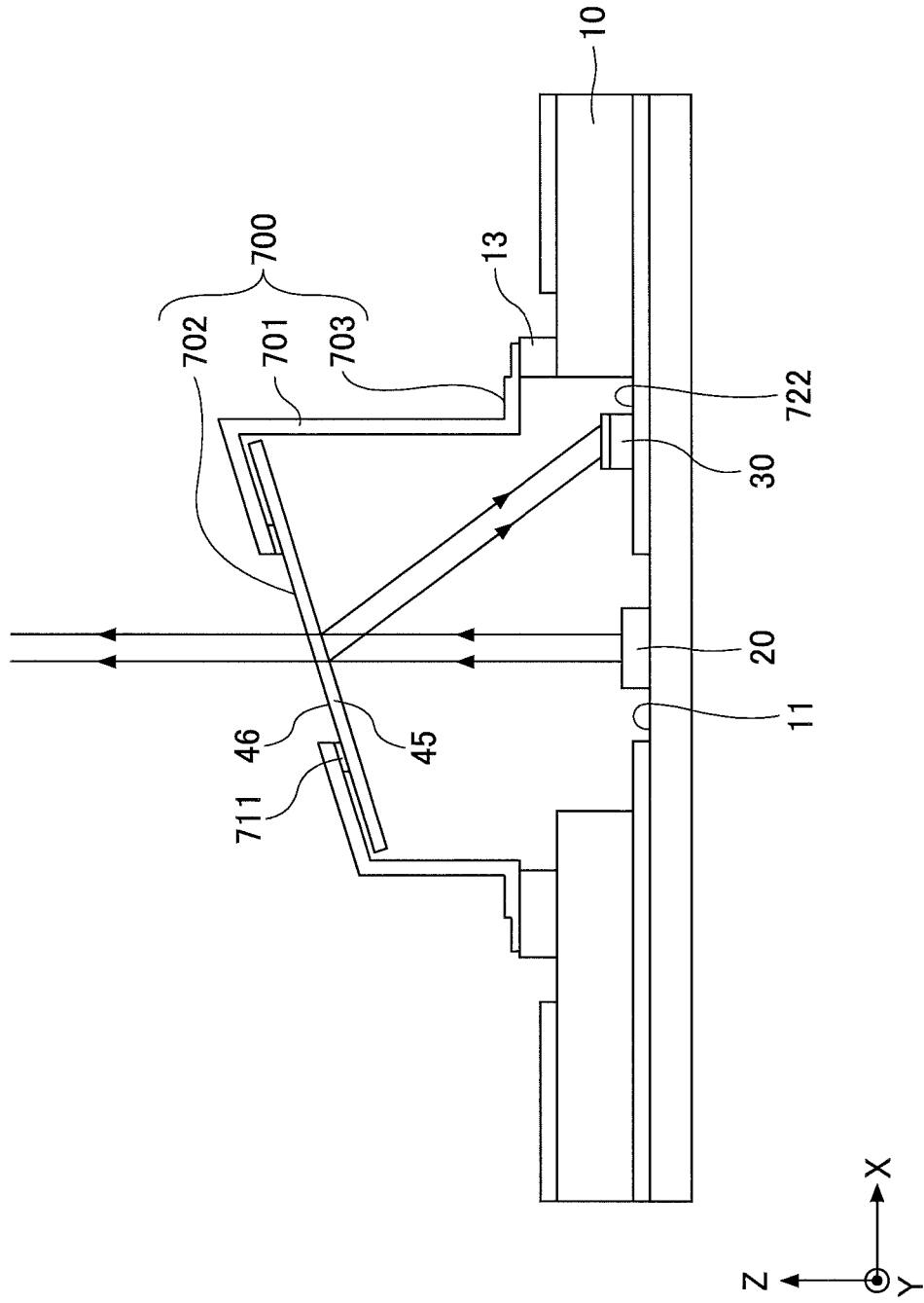
FIG. 14 is a fourth structural diagram of the other surface emitting laser module according to the first embodiment.

Next, a position of a photo diode 30 provided at the package 10 is described. FIG. 13 shows a surface emitting laser module when the surface emitting laser element 20 and the photo diode 30 are provided on the same bottom face 11 in the package 10, while FIG. 14 shows a surface emitting laser module when the photo diode 30 is provided on a stage 722 which is 0.3 mm higher than the bottom face 11 on which the surface emitting laser element 20 is provided. At the lid 700, the cover glass 701 which is a transparent member is joined to the lid body 701 with low melting glass 711.

Figure 15:
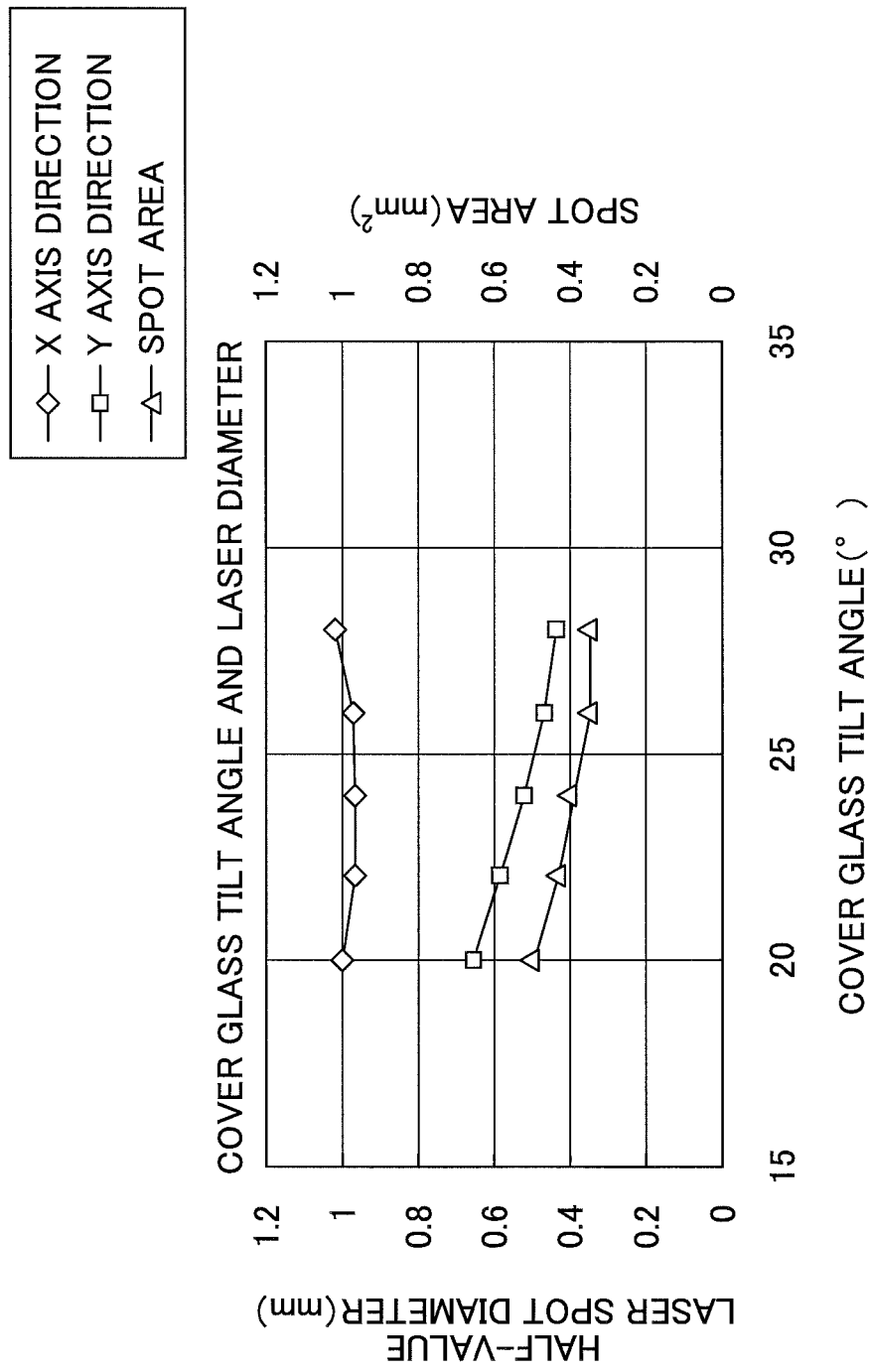
FIG. 15 is a diagram of a correlation between a laser spot diameter and a tilt angle of a cover glass of a surface emitting laser module with a structure shown in FIG. 13.
Figure 16:
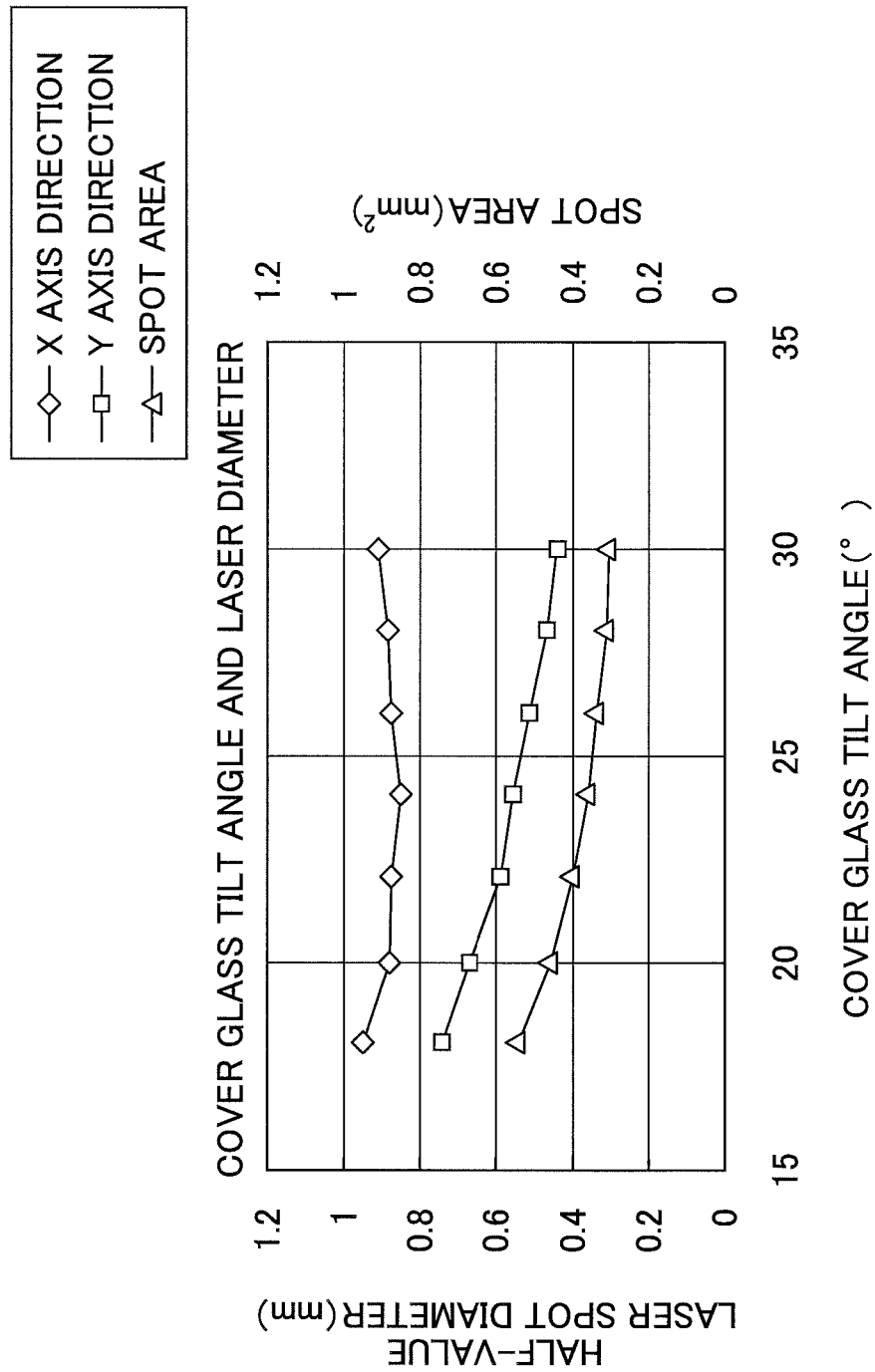
FIG. 16 is a diagram of a correlation between a laser spot diameter and a tilt angle of a cover glass of a surface emitting laser module with a structure shown in FIG. 14.

FIG. 15 shows results of computing a size of a half-value laser spot which is incident onto a face of the photo diode 30 in the surface emitting laser module of the structure shown in FIG. 13, while FIG. 16 shows results of calculating the size of the half-value laser spot which reaches onto the face of the photo diode 30 in the surface emitting laser module of the structure shown in FIG. 14. In FIGS. 13 and 14, an x-axis direction is a straight line direction which connects a center of the surface emitting laser element 20 and a center of the photo diode 30, while Y-axis direction is a direction which is parallel to a bottom face 11 of the package 10 and which is perpendicular to the X-axis direction. A tilt angle of the cover glass 702 which is a respective transparent member is an angle of the cover glass 702 that is changed with a portion to be an upper right portion of the lid 700 being fixed in FIGS. 13 and 14. Then, half-value laser spots in the X and Y directions are multiplied to obtain a laser area and a graph thereof.

As shown in FIG. 16, the photo diode 30 is provided on a stage 722, which is higher than the bottom face 11 of the package 10, on which bottom face 11 the surface emitting laser element 20 is provided, so that an area of a laser spot which is projected on a face of the photo diode 30 has become small. A Gaussian distribution in the X-axis and Y-axis directions is prepared from the half-value laser spots, what energy proportion an incidence is made on a light receiving area of the photo diode 30 is computed, and the proportion in the X-axis direction and the proportion in Y-axis direction are multiplied with each other to calculate a proportion of energy which is incident as a laser spot. A graph of these values, or, in other words, a relationship between a light receiving proportion and a tilt of the cover glass 702 in the surface emitting laser module in FIG. 13 is shown in FIG. 17, while a relationship between a light receiving proportion and a tilt of the cover glass 702 in the surface emitting laser module in FIG. 14 is shown in FIG. 18.

Figure 17:
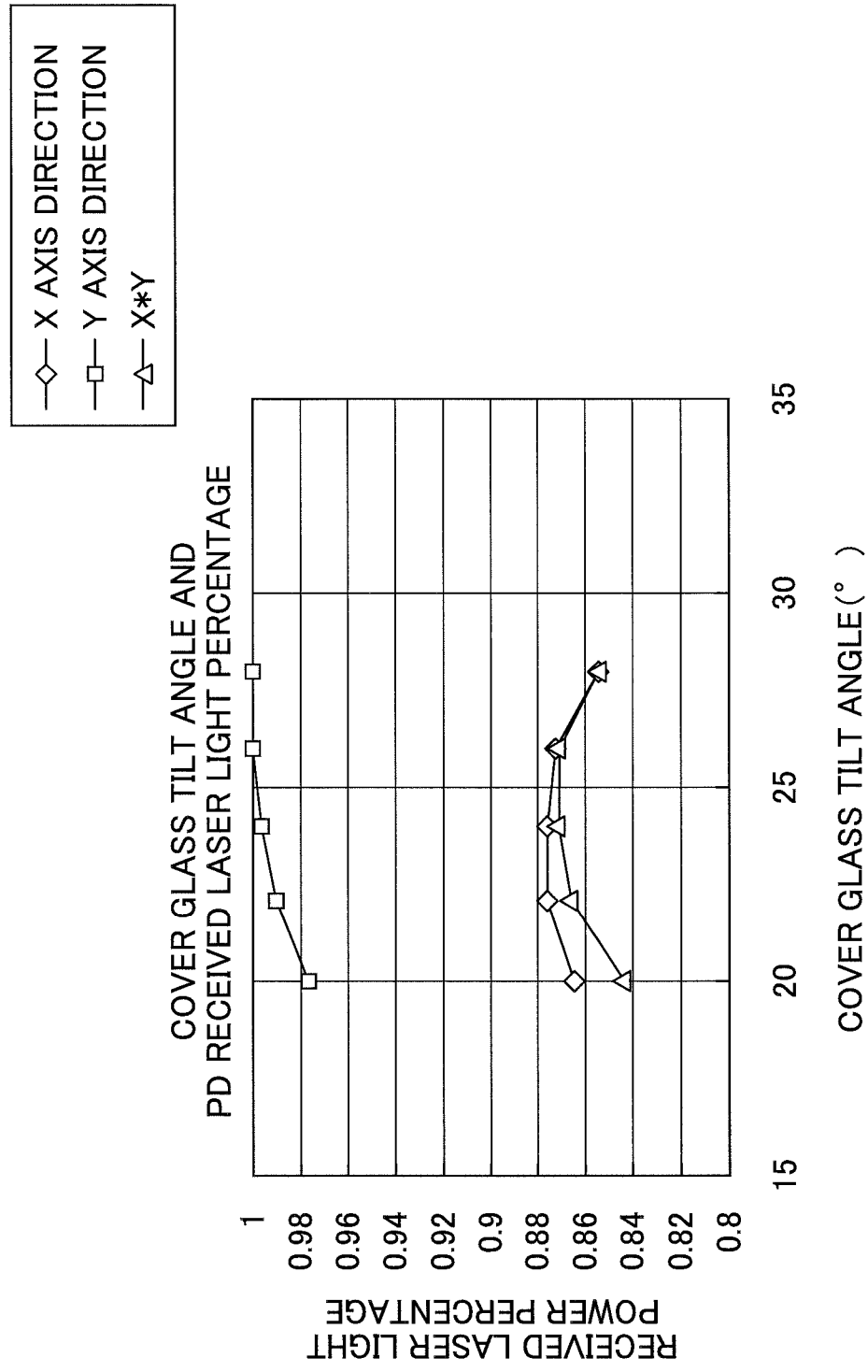
FIG. 17 is a diagram of a correlation between a light receiving percentage at a light receiving element and tilt angle of a cover glass of the surface emitting laser module with a structure shown in FIG. 13.
Figure 18:
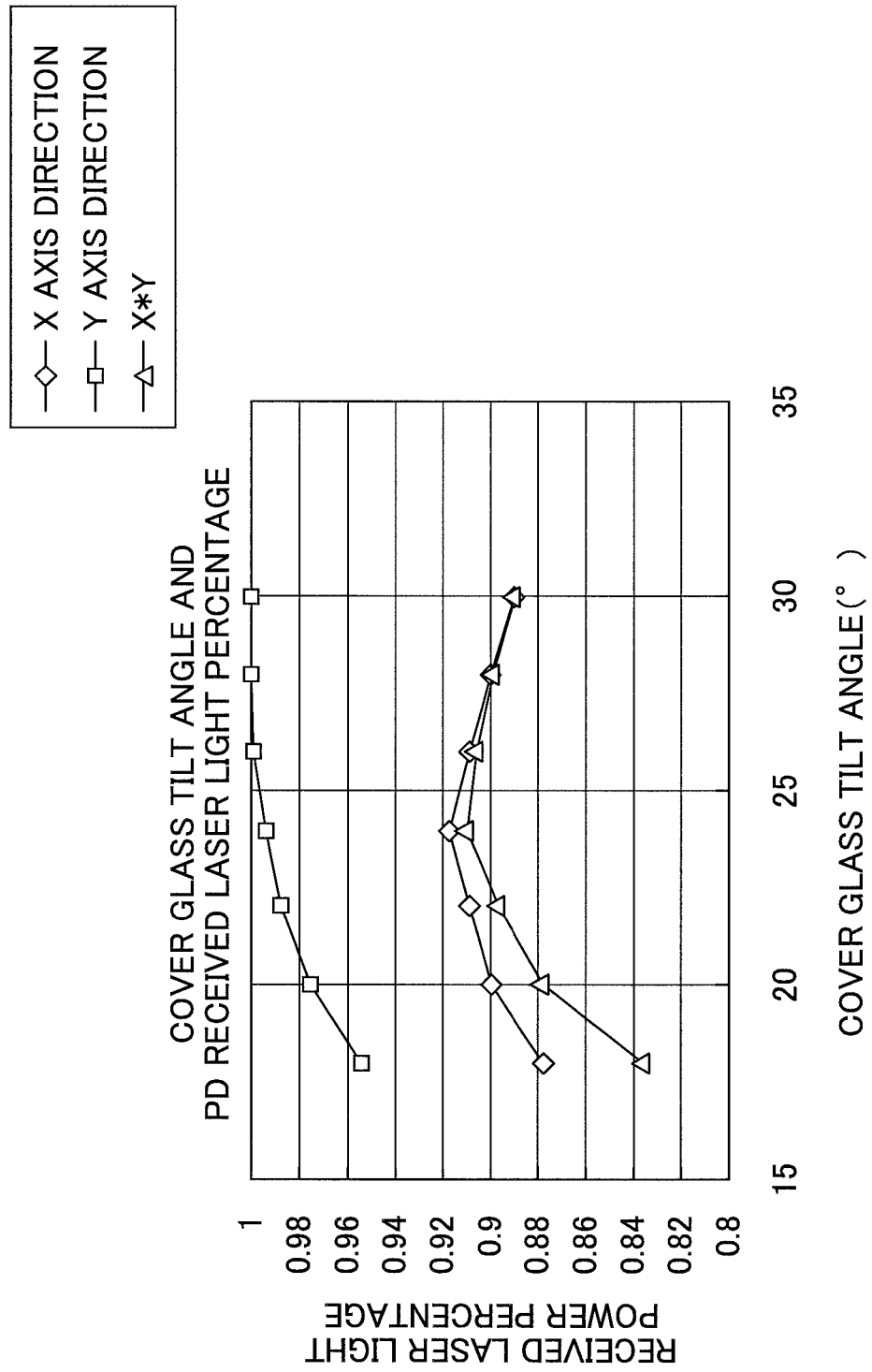
FIG. 18 is a diagram of a correlation between a light receiving percentage at a light receiving element and a tilt angle of a cover glass of the surface emitting laser module with a structure shown in FIG. 14.

As shown in FIGS. 17 and 18, the photo diode 30 may be provided on a stage 722, which is higher than the bottom face 11 of the package 10, on which bottom face 11 the surface emitting laser element 20 is provided to lead to a received power proportion which widens an angle of the cover glass 702, which is a transparent member. In FIGS. 13 and 14, it is also effective to apply a reflection preventive coating, etc., inside the lid 700 in order to prevent a beam reflected by the cover glass 702, which is a transparent member, from being irregularly reflected within the package 10 and from being incident on an emission outlet of the multi-channel surface emitting laser as feedback light.

Moreover, the photo diode 30 may be provided on the stage 722, which is higher than the bottom face 11 of the package 10, on which bottom face 11 the surface emitting laser element 20 is provided to form a wiring connected to the surface emitting laser element 20 under the stage 722 on which the photo diode 30 is provided, or in other words, between the stage 722 and the bottom face 11. In this way, a design may be selected which maintains symmetry of shape of the package 10 for complicated wirings within the multi-channel surface emitting laser. In this way, when the package 10 is formed with a package made of ceramics, a distortion at the time of burning may be made extremely small.

In this way, an emission angle of the surface emitting laser in the surface emitting laser element 20 may be stably set to be vertical, making it possible to simply and easily improve the property as a laser for writing. This is very important in a multi-channel surface emitting laser array with at least 10 channels. Moreover, this makes it possible to decrease a defect rate and to reduce cost.

Moreover, in this case, a light receiving face of the photo diode 30 is cylindrically shaped, so that variations between channels in a proportion of power of received light which is incident to the photo diode 30 become smooth, and control of a multi-channel laser with at least 10 channels becomes easy in one photo diode 30. When the photo diode 30 with a light receiving face having a rectangular shape is used, a difference in a position of a circle-shaped (an oval-shaped) laser spot does not result in a smooth change for each channel at rectangular corners, so that it is difficult to control a large number of laser channels in one photo diode 30.

Moreover, very precise angle control is needed when utilizing, as a monitor current, reflection from the cover glass 702 as a transparent member which is fitted into the lid 700. In order to keep a difference between a maximum value and a minimum value of individual monitor currents of a large number of laser channels to within 20%, +/−1 degree or below is required at 3 σ for the angular variation. As a result of the inventors, etc., of the present invention zealously studying to solve the present problems, the lid body 701 may be arranged to be made of metal and to be molded, and the cover glass 702, which is a transparent member, may be arranged to be fixed from inside the lid body 701 using a low melting point glass 711, which melts at 500° C. or below to obtain an optical device to be a surface emitting laser module which has preferable angular precision such that it is completely sealed inside a space surrounded by the package 10 and the lid 700, so that corrosion due to oxygen or water does not occur.

The reason for using the low melting point glass 711, which melts at 500° C. or below is that a general glass starts deforming at around 550° C., so that a material to be used for joining a transparent member needs to be made of glass that withstands long melting and adhering times with almost no deforming. The low melting point glass, which is made with soda and lime glass as a standard and which is deemed to be not clearly defined with respect to a melting point temperature thereof, is a glass with a melting point which is lower relative to the general glass. As described above, the low melting point glass, which is usually used for joining of materials such as a glass, etc., is formed such that the melting temperature becomes low.

As described above, very precise angle control is needed in the present embodiment; however, angular variations (see Table 1 below) occur with the tilt of the glass 790 as shown in FIG. 19 that is used in the related art, so that it is not suitable for use in the present embodiment. Table 1 shows data on variations of tilts of a glass when respective implementations are performed for the surface emitting laser module with structures on FIGS. 14 and 19 such that tilt angles of the cover glass 702 or the glass 790 are aimed to become 19 degrees. The precision and variations show very preferable values in the surface emitting laser module with a structure shown in FIG. 14, representing advantageous effects of the surface emitting laser module according to the present embodiment.

TABLE 1

| | REFLECTION ANGLE OF GLASS (°) | |
| --- | --- | --- |
| SAMPLE | GLASS TILTING OF FIG. 14 | GLASS TILTING OF FIG. 19 |
| 1 | 18.44 | 19.96 |
| 2 | 19.27 | 20.63 |
| 3 | 19.04 | 20.15 |
| 4 | 19.01 | 18.52 |
| 5 | 19.07 | 19.57 |
| 6 | 18.98 | 20.36 |
| 7 | 19.33 | 19.76 |
| 8 | 18.99 | 20.77 |
| 9 | 18.67 | 18.67 |
| 10 | 19.24 | 19.44 |
| 11 | 18.92 | 20.02 |
| 12 | 19.22 | 18.17 |
| 13 | 18.87 | 19.73 |
| 14 | 18.67 | 20.46 |
| 15 | 18.81 | 19.71 |
| 16 | 18.89 | 20.25 |
| 17 | 18.71 | 17.82 |
| 18 | 19.04 | 19.93 |
| 19 | 19.02 | 19.44 |
| 20 | 18.59 | 19.82 |
| Ave. | 18.94 | 19.66 |
| σ | 0.24 | 0.80 |
| Ave . . . + 3 σ | 19.65 | 22.07 |
| Ave . . . − 3 σ | 18.22 | 17.25 |

When a metal lid is used for the lid body 701 of the lid 700, the lid 700 having a very precise angle may be made, but with a disadvantage that cost ends up somewhat high. In particular, when sealing using seam welding, the trouble and the equipment also become a cause of high cost. Thus, the lid 700 may be mounted, not by seam welding, but by sealing with an adhesive, to decrease the cost. Thus, in the present embodiment, implementation using an adhesive may also be selected, and what has such a structure includes a surface emitting laser module of a structure shown in FIGS. 2 and 3 as described above. However, when a glass, etc., are sealed to the package 10 with an adhesive, the adhesive has a property that it passes through a small amount of water content, so that an amount of water within the surface emitting laser module ends up gradually increasing. In such a case, when a sudden temperature change occurs, condensation could occur within the surface emitting laser module.

(Evaluation of Properties of the Surface Emitting Laser Module)

Figure 20A:
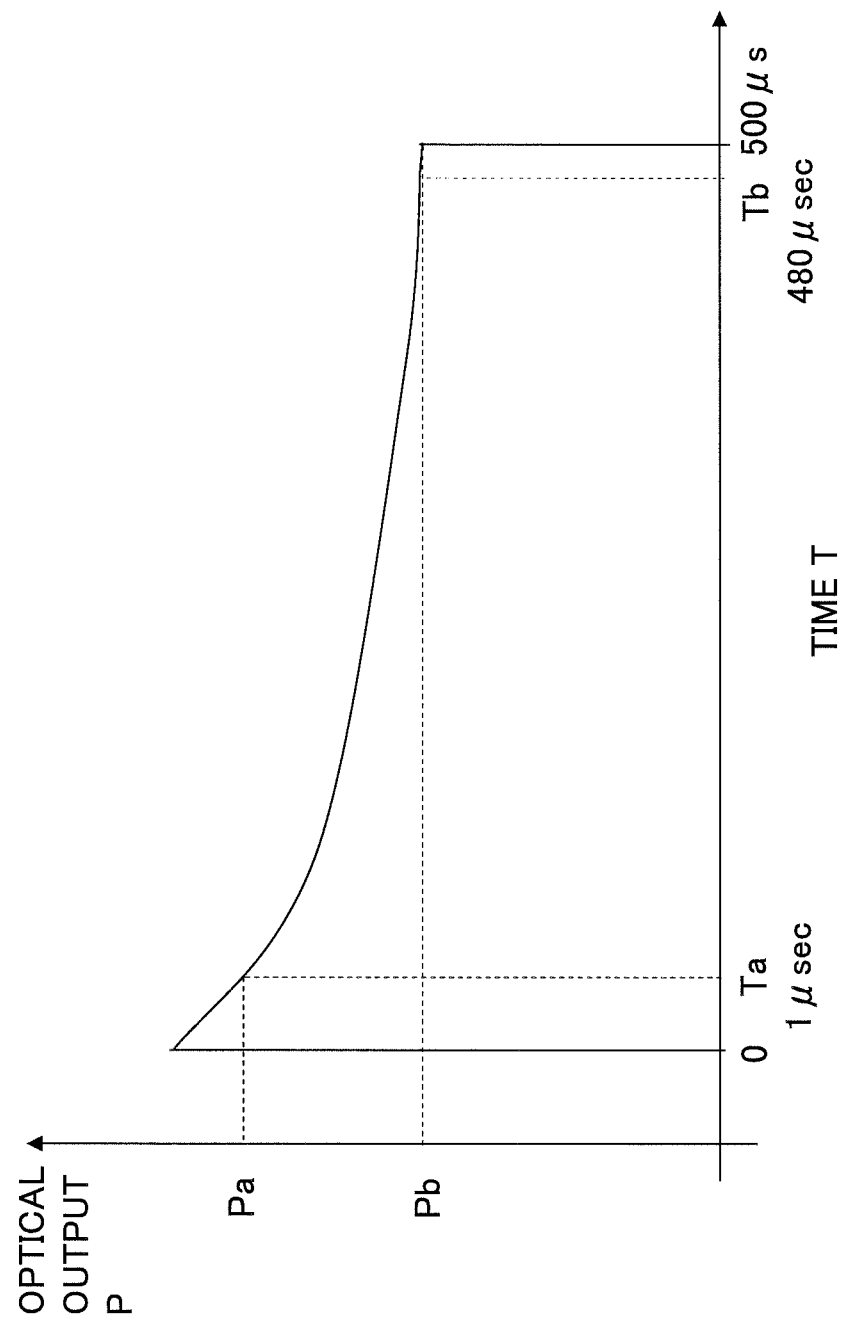

Next, properties of a surface emitting laser module formed with the above described surface emitting laser element are described. As the surface emitting laser module and the light source unit, properties are evaluated using optical systems which imitate the structure shown in FIG. 1. As an evaluation of properties, a light amount of the emitted beam is detected with a photo diode (PD). Ideal waveform data obtained are shown in FIG. 20A. However, when influenced by feedback light, the light amount becomes unstable, and change occurs. In FIG. 20B is schematically shown an abnormal waveform 125a when an light amount change occurs relative to a normal waveform 125b with no light amount change. As shown in FIG. 20B, while the abnormal waveform 125a often appears such that it waves in a first half of the waveform, it is not limited thereto, so that it may appear such that it waves in a second half of the waveform. Moreover, a waveform change may occur even when a frequency is 1 kHz, or in a much larger waveform such as a waveform of several hundreds of kHz. In particular, when a waveform at 1 kHz is set to be a standard for stably drawing one line necessary for an image forming apparatus, the stability becomes a problem even with a 5% level change depending on the image forming apparatus. Here, as a characteristic required for the image forming apparatus, a method of quantifying the characteristic value is described. In general, it is an indicator which evaluates a change of a light amount of laser due to heat and is used as a droop value. More specifically, as shown in FIG. 20A, a difference is taken between a light amount of a laser rising time zone and a time zone during which time has elapsed sufficiently. As one example, a waveform with a duty ratio of 50% at 1 kHz is shown.

$$Dr=(Pa-Pb)/Pa$$

Pa: optical output value at time Ta
Pb: optical output value at time Tb

A numerical value Dr (%) shown in the above equation is defined as a droop value. In the present embodiment, it is set that the duty is 50% at 1 kHz, Ta is at a 1 μs position, and Tb is at a 480 μs position at 1 kHz. The optical output is set on the order of 1.4 mW, and a measurement temperature is adjusted by a temperature adjusting fixture to be 25° C. While the output and the temperature are arranged as described in the present embodiment, the present measurement is conducted with respect to output values and temperatures used, so that it is not limited thereto. The frequency, duty ratio, and Ta and Tb are conditions necessary to form a high-precision image as an image forming apparatus.

Moreover, when multiple surface emitting lasers are aligned and arranged as a surface emitting laser array, viewability of images formed is notably degraded unless one droop value matches another. As a characteristic of the surface emitting laser array, a difference (below called a variation) between a maximum value and a minimum value of the droop value needs to be reduced. However, when the abnormal waveform 125a appears, the variation becomes large. Thus, it is made a condition that the variation of the droop value satisfies the following equation:

$$\text{variation (\%) of droop}=Dr(\max)-Dr(\min)$$

Dr(max): a Dr value of an element with a largest Dr value out of multiple elements
Dr(min): a Dr value of an element with a smallest Dr value out of the multiple elements The viewability is notably degraded at the time an image is formed once the variation of the droop under the above-described condition exceeds 3%. Image degradation due to a large droop value in one element also applies for a surface emitting laser which includes multiple elements aligned.

Figure 21:
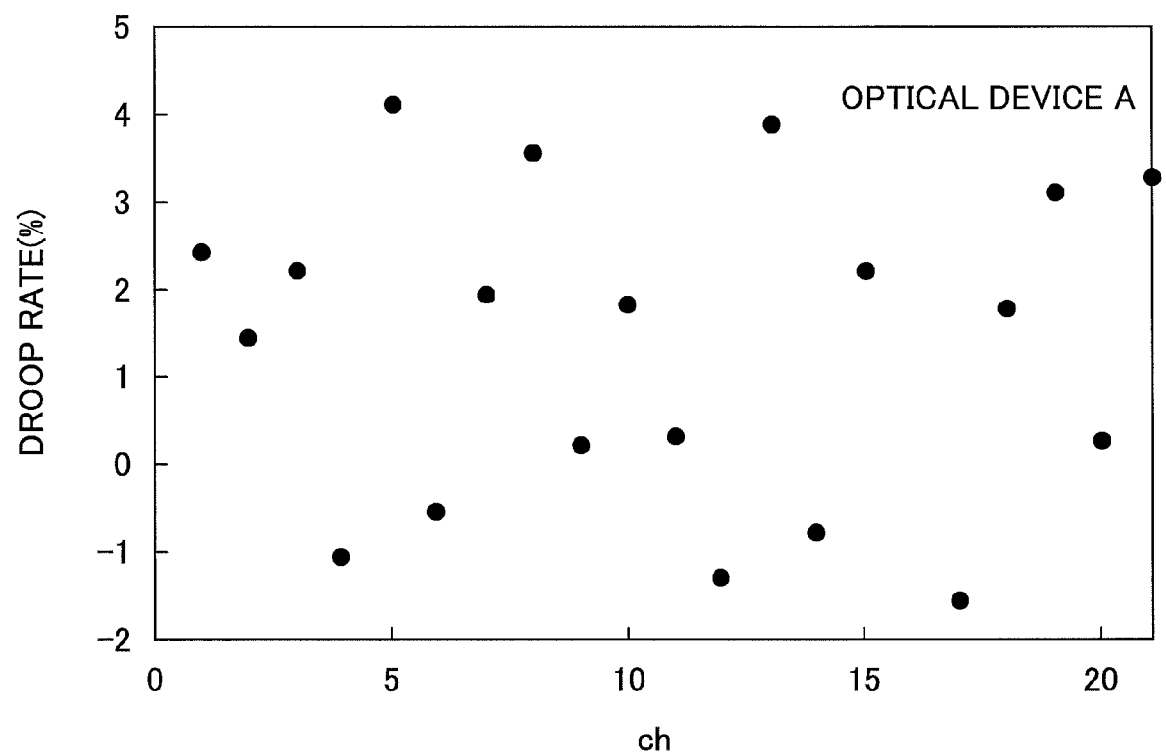
FIG. 21 is a first diagram of a characteristic of a droop rate.

FIG. 21 shows a droop rate in a surface emitting laser module (called an optical device A) which includes a surface emitting laser array including 21 light emitting sections (ch 1 to ch 21) and a metal lid to which is fusion welded, with a low melting point glass, a glass plate (reflectance of approximately 8.6% for upper and lower faces combined) to be a transparent member, a surface of which glass plate is not coated with a reflection preventing layer, and which transparent member is not tilted relative to an emission face of the surface emitting laser array. At each of the light emitting sections, a mode filter is not provided.

A large droop rate is 4%, while a small droop rate is −1.5%. This shows that an output waveform is an abnormal waveform, and the abnormal shape is not uniform from one light emitting section to another. Such a variation ends up being observed even with a reflectance of only 5.2% when there is no reflection preventing coating. In this way, a high quality image may not be formed when a surface emitting laser module is used which has a large droop rate variation between light emitting sections.

Figure 22:
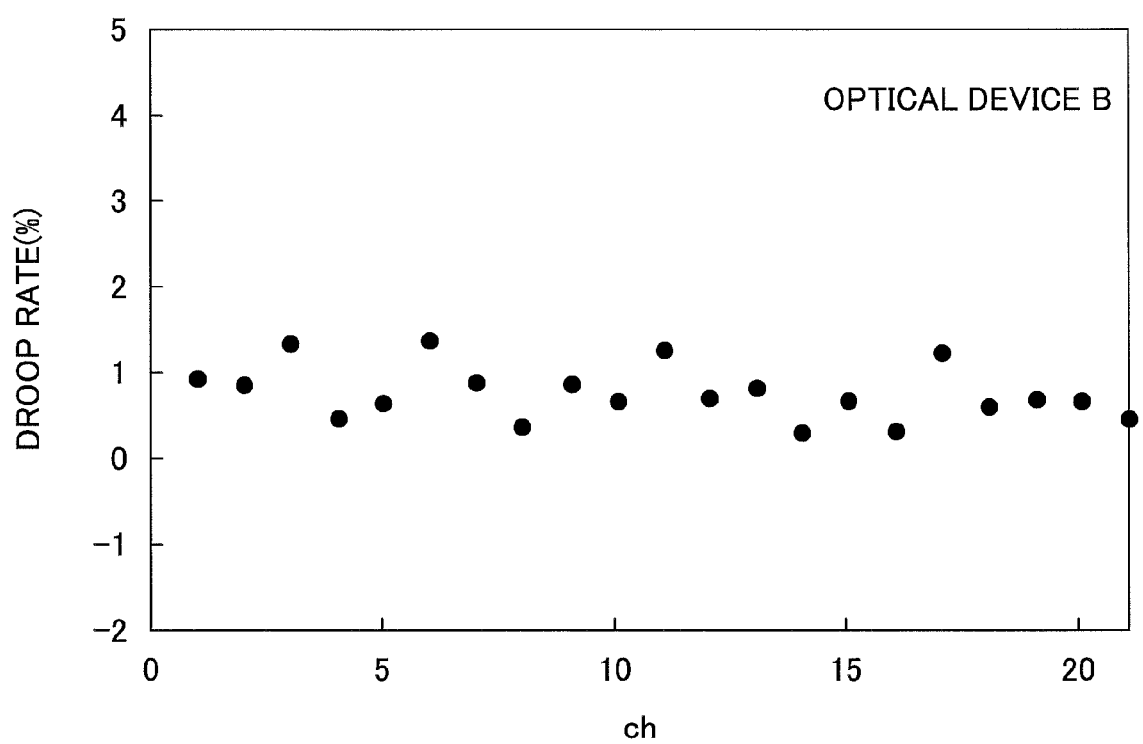
FIG. 22 is a second diagram of the characteristic of the droop rate.

FIG. 22 shows a droop rate in a surface emitting laser module (called an optical device B) which includes a surface emitting laser array having 21 light emitting sections (ch1-ch21) and a metal lid to which is fusion welded a glass plate with a low melting point glass, upper and lower faces of a glass of which glass plate are coated with a reflection preventing layer (reflectance of upper and lower faces combined is approximately 0.1%), and in which the glass plate is not tilted relative to an emission face of the surface emitting laser array. At each of the light emitting sections, a mode filter is not provided. A large droop rate is 1.5%, while a small droop rate is 0.2%, so it is seen that the variation is significantly reduced.

In this way, a glass plate on which is provided a reflection preventing coating with a very low reflectance is used, so that resistance to feedback light becomes strong and a variation of the droop rate becomes small. Then, an abnormal waveform and an change in light amount can be suppressed. However, unless a glass plate is arranged to be tilted, it is not possible to make an optical device which is a surface emitting laser module having a multi-channel surface emitting laser of at least 10 channels that has a structure with a photo diode also being integrated that is an objective of the present inventors.

Thus, the inventors have studied variations in the droop rate, when using a metal lid to which a tilted glass plate is fusion welded with a low melting point glass, a lower portion of which glass plate is coated with a layer which shows a 10% reflectance for a wavelength of 780 nm and an upper portion of which glass plate is provided with a reflection preventive layer, where feedback light to the surface emitting laser array is removed due to the tilting, and a monitor beam source is reflected to a photo diode for monitoring.

Figure 23:
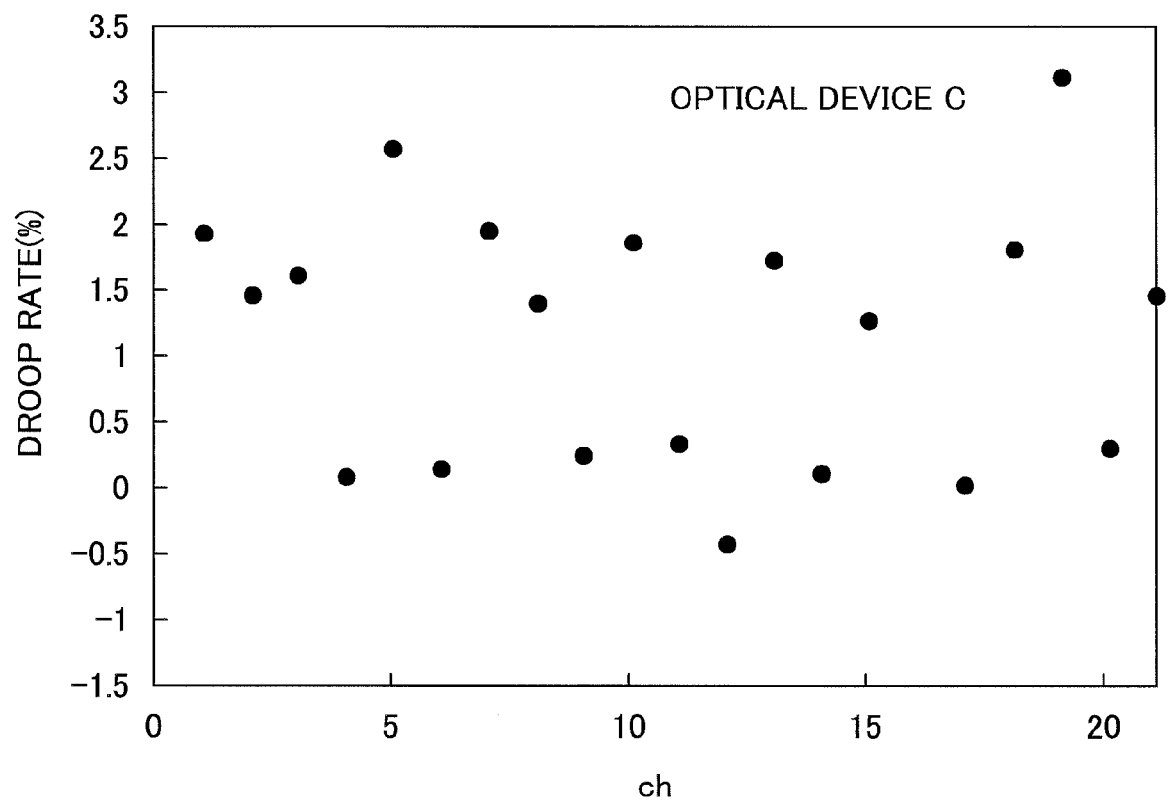
FIG. 23 is a third diagram of the characteristic of the droop rate.

FIG. 23 shows a droop rate in a surface emitting laser module (an optical device C) which includes a surface emitting laser array having 21 light emitting sections (ch1-ch21), which uses a metal lid which is provided with a reflection preventing layer on an upper portion of the glass plate and to which metal lid is fusion welded a tilted glass plate with a low melting point glass, which glass plate is coated on a lower portion thereof with a layer which shows reflectance of 10% for a wavelength of 780 nm, and which is tilted by 8 degrees relative to an emission face of the surface emitting laser array. At each of the light emitting sections, a mode filter is not provided. A large droop rate is 3%, while a small droop rate is 0.5%, so it is seen that a variation is significantly reduced relative to the optical device A. However, a variation of the droop rate is large relative to the optical device B, so that a tilt angle of 8 degrees is deemed still not sufficient.

Figure 24:
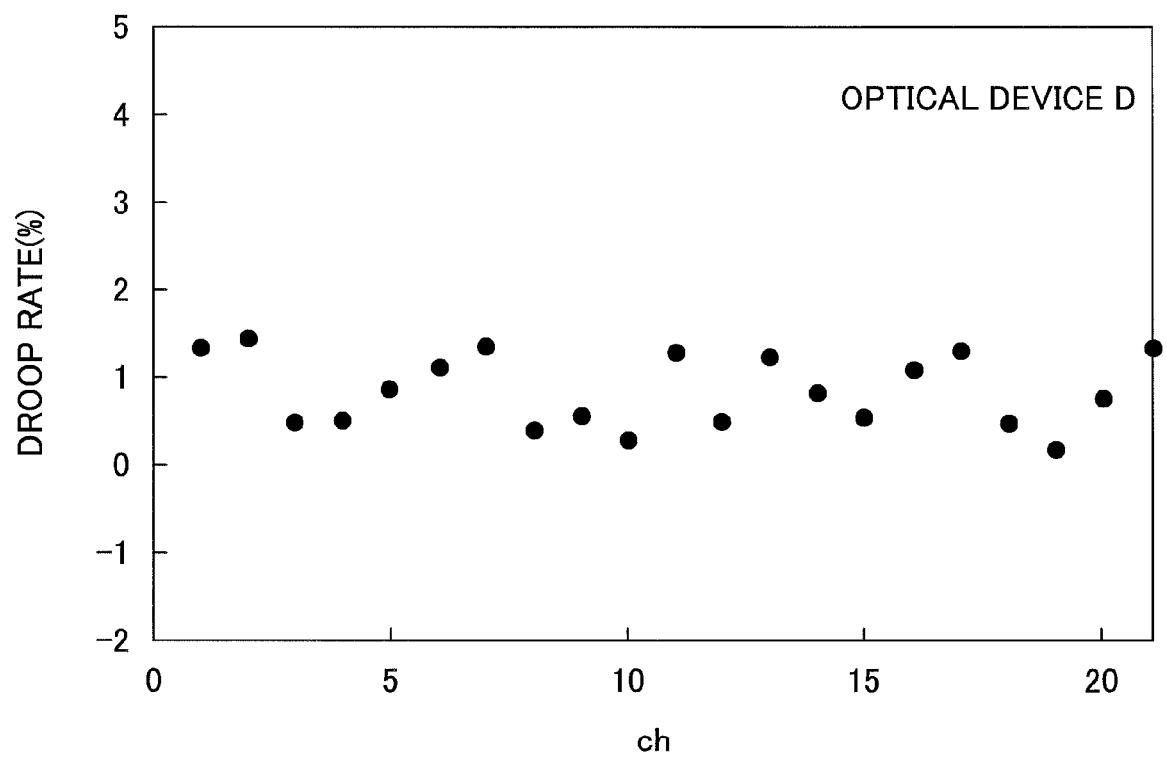
FIG. 24 is a fourth diagram of the characteristic of the droop rate.

FIG. 24 shows a droop rate in a surface emitting laser module (an optical device D) which includes 21 light emitting sections (ch1-ch21), which uses a metal lid which is provided with a reflection preventing layer on an upper portion of a glass plate and to which metal lid is fusion welded a tilted glass plate with a low melting point glass, which glass plate is coated on a lower portion thereof with a layer which shows reflectance of 10% for a wavelength of 780 nm, and which is tilted by 10 degrees relative to an emission face of the surface emitting laser array. At each of the light emitting sections, a mode filter is not provided.

Figure 25:
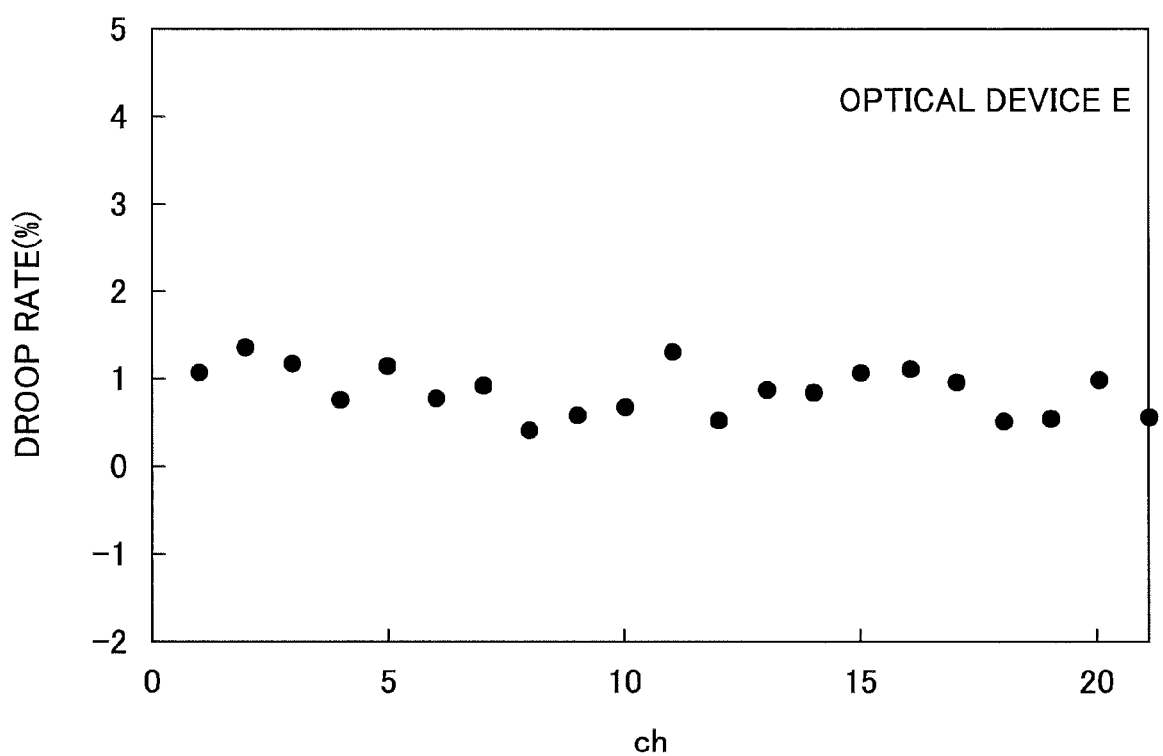
FIG. 25 is a fifth diagram of the characteristic of the droop rate.

Moreover, FIG. 25 shows a droop rate in a surface emitting laser module (an optical device E) which includes 21 light emitting sections (ch1-ch21), which uses a metal lid which is provided with a reflection preventing layer on an upper portion of a glass plate and to which metal lid is fusion welded a tilted glass plate with a low melting point glass, which glass plate is coated on a lower portion thereof with a layer which shows reflectance of 10 degrees for a wavelength of 780 nm, and which is tilted by 15 degrees relative to an emission face of the surface emitting laser array. At each of the light emitting sections, a mode filter is not provided.

Figure 26:
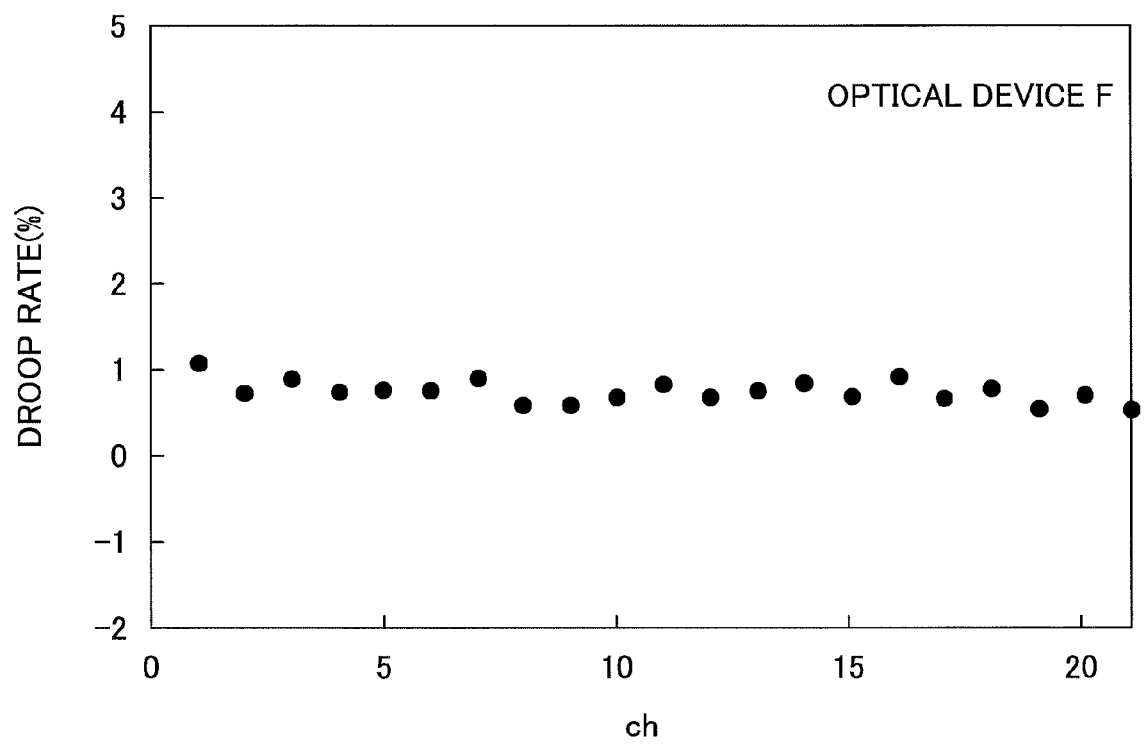
FIG. 26 is a sixth diagram of the characteristic of the droop rate.

Furthermore, FIG. 26 shows a droop rate in a surface emitting laser module (an optical device F) which includes 21 light emitting sections (ch1-ch21), which uses a metal lid which is provided with a reflection preventing layer on an upper portion of a glass plate and to which metal lid is fusion welded a tilted glass plate with a low melting point glass, which glass plate is not coated on a lower portion thereof so as to enable reflection using a difference between a refractive index of air and a refractive index of glass, and which glass plate is tilted by 15 degrees relative to an emission face of the surface emitting laser array. At each of the light emitting sections, a mode filter is not provided.

In the optical devices D and E, a variation in the droop rate is less than or equal to that in the optical device B.

In this way, it has been revealed that an advantageous effect may be expected which is equivalent to using a glass with a reflection preventing coating and a metal lid which holds the glass even when using a resin lid which is integral with a transparent member which is not coated on a surface with a reflection preventing layer by tilting the same. In other words, even when a reflective transparent member is used, a problem of feedback light may be solved by tilting the same.

Moreover, for a droop rate of a multi-channel surface emitting laser with at least 10 channels as used in the present invention, values thereof are provided generally for all of the channels in FIGS. 21-26. In this way, providing with all of numerical values of multiple channels that are reflected by a reflecting face is a very difficult technique, so that here the advantageous effect of the present invention may be very suitably confirmed.

In this way, in the present embodiment, a lid is formed such that a tilt angle θ of a transparent member becomes 17 degrees.

(Manufacturing Method of Surface Emitting Laser Module)

Next, based on FIGS. 2 and 3, a manufacturing method of a surface emitting laser module according to the present embodiment is described.

First, a surface emitting laser array chip which is a surface emitting laser element 20 is die bonded to the bottom face 11 of a concave section of the package 10.

Next, multiple leads, or metal wirings (not shown) in the package 10 and multiple electrode pads in the surface emitting laser array chip which is the surface emitting laser element 20 are respectively connected electrically by wire bonding.

Next, the photo diode 30 is die bonded to the stage 12 of the package 10.

Next, a lead wiring or a metal wiring (not shown) of the package 10 and an anode electrode of the photo diode 30 are electrically connected by wire bonding, while a cathode on a back face is grounded by a conductive adhesive.

Next, the photo diode 30 and a surface emitting laser array chip which is a surface emitting laser element 20 are fixed and a lid 40 is placed on the package 10 which is electrically connected to each thereof.

Next, an adhesive (an ultraviolet hardening type resin adhesive) is applied for fixing the lid 40 which is placed on the package 10. While the adhesive is applied such that the package connecting section 13 in the package 10 and the lid connecting section 43 in the lid 40 are connected, it is not applied over all of the faces, so that the adhesive is not applied to the unconnected region 52. In this way, a region on which the adhesive is not applied becomes a water content transmitting region.

Moreover, for a lid 60 having a quadrilateral shape as shown in FIG. 10, the adhesive is applied in the vicinity of three of four sides.

For example, as shown in FIG. 27, when the adhesive is applied in an adhesive applying region 80 in the vicinity of three sides of the lid 60 and the package 10, the adhesive is applied in a sequence as shown with an arrow in FIG. 28.

Next, after applying of the adhesive is completed, the adhesive is hardened. Here, an ultraviolet irradiating apparatus is brought in to harden the adhesive. In this way, a transparent member to be the window 41 in the lid 40 is fixed to the package 10 with the transparent member being tilted approximately 17 degrees relative to a face perpendicular to an emitting direction of a beam of a surface emitting laser in the surface emitting laser array chip which is a surface emitting laser element 20.

As shown in FIG. 29, for the lid 60 having the quadrilateral shape as shown in FIG. 10, it is also possible to apply the adhesive in an adhesive applying region 80 in the vicinity of opposing two sides of the lid 60 and the package 10. In this case, it has been confirmed that increase in water content inside is further suppressed, so that inconveniences such as condensation, etc., are not likely to occur.

Moreover, for the lid 70 in FIG. 11, even when all four sides are adhered with the adhesive, no problems such as condensation, etc., occur as the lid 70 includes the water content transmitting section 74 which includes water content transmitting and adjusting functions.

While a surface emitting laser module is described in the present embodiment, in which a transparent member to be the window 41 of the lid 40 is tilted by approximately 17 degrees relative to a face which is perpendicular to an emission direction of a beam of a surface emitting laser in a surface emitting laser array chip which is the surface emitting laser element 20, it is not limited thereto, so that preferably an angle of tilt is at least 10 degrees and more preferably the angle of tilt is at least 15 degrees.

(Surface Emitting Laser Array)

Next, a surface emitting laser array according to the present embodiment is described. The surface emitting laser array according to the present embodiment is such that multiple of the above-described surface emitting lasers are two-dimensionally formed.

Figure 30:
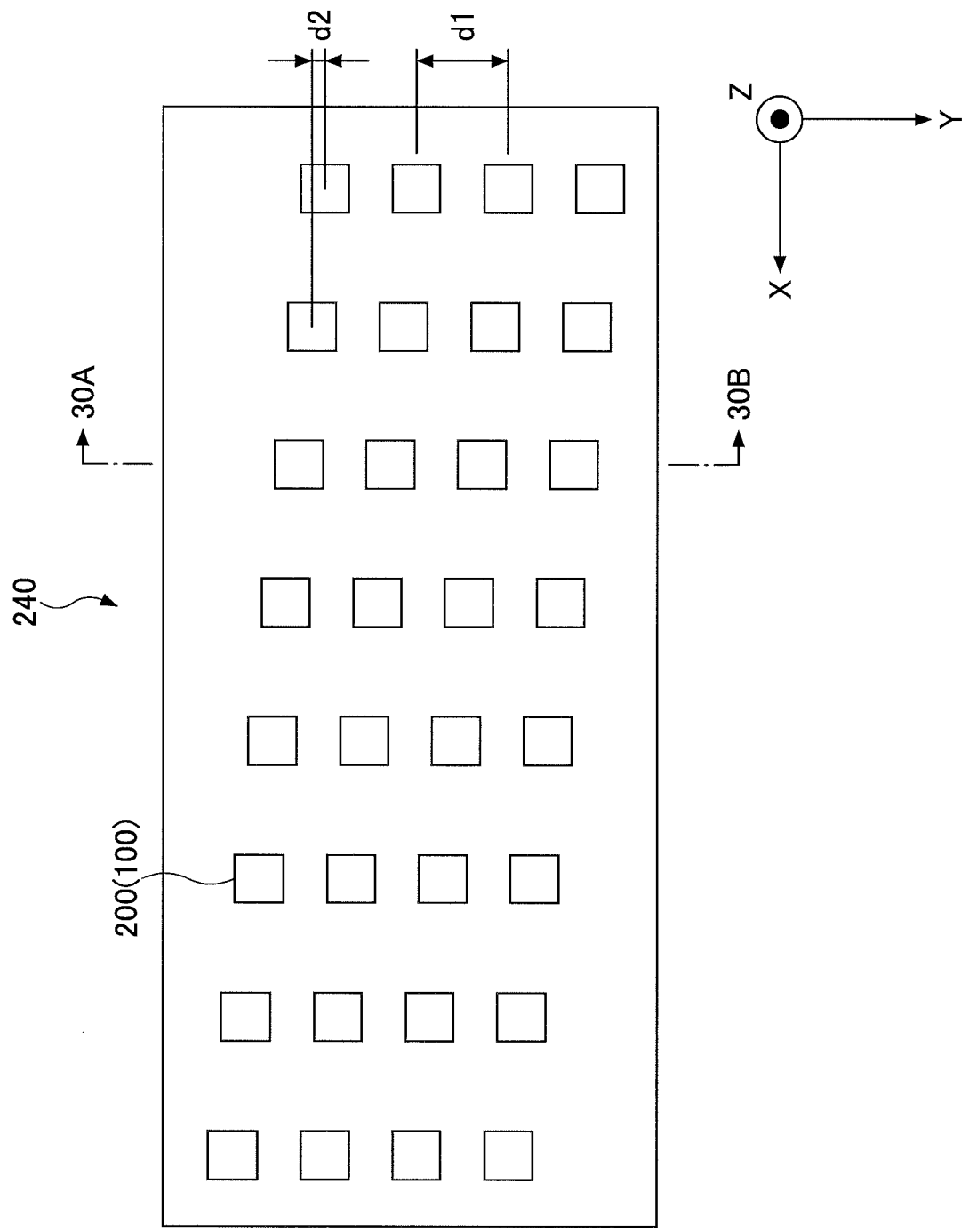
FIG. 30 is a configuration diagram of a surface emitting laser array according to the first embodiment of the present invention.

Based on FIG. 30, a surface emitting laser array 240 according to the present embodiment is described. In the surface emitting laser array 240 according to the present embodiment, multiple (32 here) surface emitting lasers to be light emitting sections 200 are arranged on the same substrate. The X-axis direction is a direction corresponding to main scanning, while the Y-axis direction is a direction corresponding to sub-scanning. Multiple light emitting sections 200 are arranged so as to yield an equal interval d2 when all of the light emitting sections 200 are orthogonally projected on an imaginary line which extends in the Y-axis direction. In this way, 32 of the light emitting sections 200 are two dimensionally aligned. Herein, "light emitting section interval" represents an intercenter distance of two light emitting sections 200. Moreover, while FIG. 30 shows the number of the light emitting sections 200 of 32, it suffices that the number of light emitting sections is a multiple number and may be 40.

Figure 31:
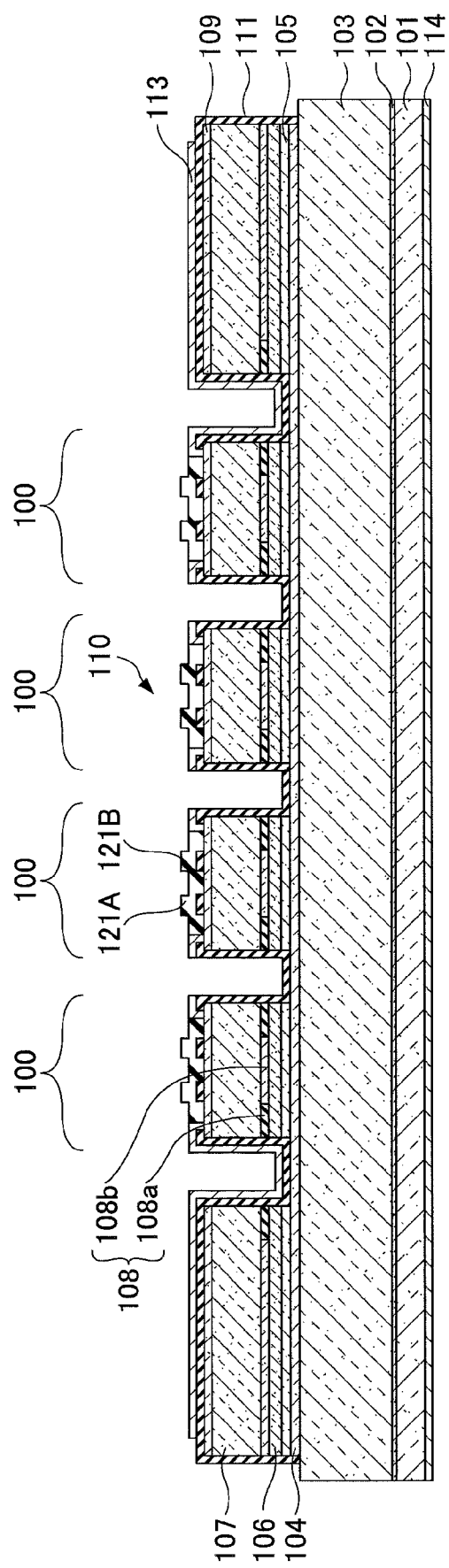
FIG. 31 is a cross-sectional diagram of the surface emitting laser array in FIG. 30.

FIG. 31 shows a cross-sectional diagram taken along a broken line 30A-30B in FIG. 30. In the surface emitting laser array 240 according to the present embodiment, each of the light emitting sections 200 includes the previously-described surface emitting laser 100. Therefore, the surface emitting laser array 240 can be manufactured using the same method as the above-described method for the surface emitting laser 100. In this way, a surface emitting laser array emits multiple laser beams of a single basic lateral mode having a deflecting direction which is uniform among the respective light emitting sections 200. The thus obtained surface emitting laser array 240 makes it possible to simultaneously form, on a below-described photoconductor drum, 32 very small light spots which are circular and which have high optical density.

Moreover, in the surface emitting laser array 240, light emitting section intervals when the respective light emitting sections are orthogonally projected on an imaginary line which extends in a direction corresponding to sub-scanning are equal intervals d2, so that a timing of illumination may be adjusted to regard the present feature the same as the feature when light emitting sections are aligned at equal intervals in the sub-scanning direction on a below-described photoconductor drum.

Then, high density writing at 4800 dpi (dots/inch) is possible when the above-described interval d2 is set equal to 2.65 and a magnification of an optical system of a below-described optical scanning apparatus is set equal to ×2. As a matter of course, the number of light emitting sections in the direction corresponding to the main scanning can be increased, an array can be arranged such that a pitch d1 in the sub-scanning direction is narrowed to further decrease the interval d2, and the magnification of the optical system can be decreased, etc., to increase the density and to achieve higher quality printing. A writing interval in the main scanning direction may easily be controlled with a timing of illumination of the light emitting section.

Now, in the surface emitting laser array 240, a groove between two neighboring light emitting sections 200 is preferably at least 5 μm for electrical and spatial separations between adjacent light emitting sections. This is because control of etching becomes difficult at the time of manufacturing if it is too narrow. Moreover, it is preferable that a size (a length of one side) of a mesa 110 is at least 10 μm. This is because heat stays at the time of operation and the performance could be degraded if it is too small.

Figure 32:
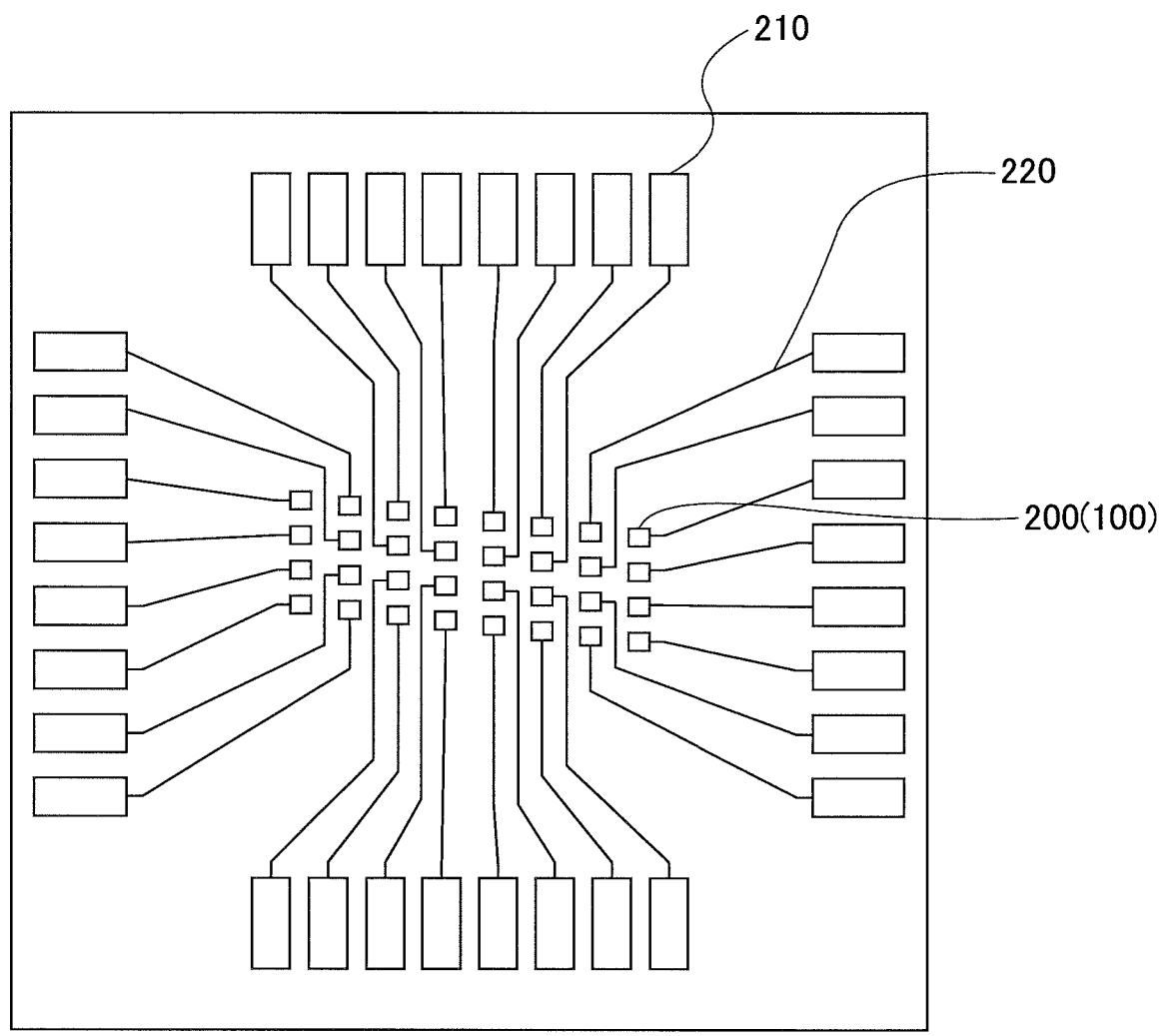
FIG. 32 is a structural diagram of a different surface emitting laser array chip according to the first embodiment.

FIG. 32 shows a wiring structure in the surface emitting laser array 240. In this way, the surface emitting laser array 240 includes 32 light emitting sections 200 which are aligned two dimensionally and 32 electrode pads 210 which are provided surrounding the 32 light emitting sections and which correspond to the light emitting sections 200. Moreover, each electrode pad 210 is electrically connected with the corresponding light emitting section 200 and wiring member 220.

Furthermore, a surface emitting laser array wherein plural surface emitting lasers 100 to be the light emitting sections 200 are one dimensionally aligned may be used in lieu of the surface emitting laser array 240 wherein the surface emitting lasers 100 are two dimensionally aligned as described above.

Second Embodiment

Next, the second embodiment of the present invention is described. The present embodiment is a laser printer 1000 as an image forming apparatus and an optical scanning apparatus 1010 which uses a surface emitting laser module according to the first embodiment.

Figure 33:
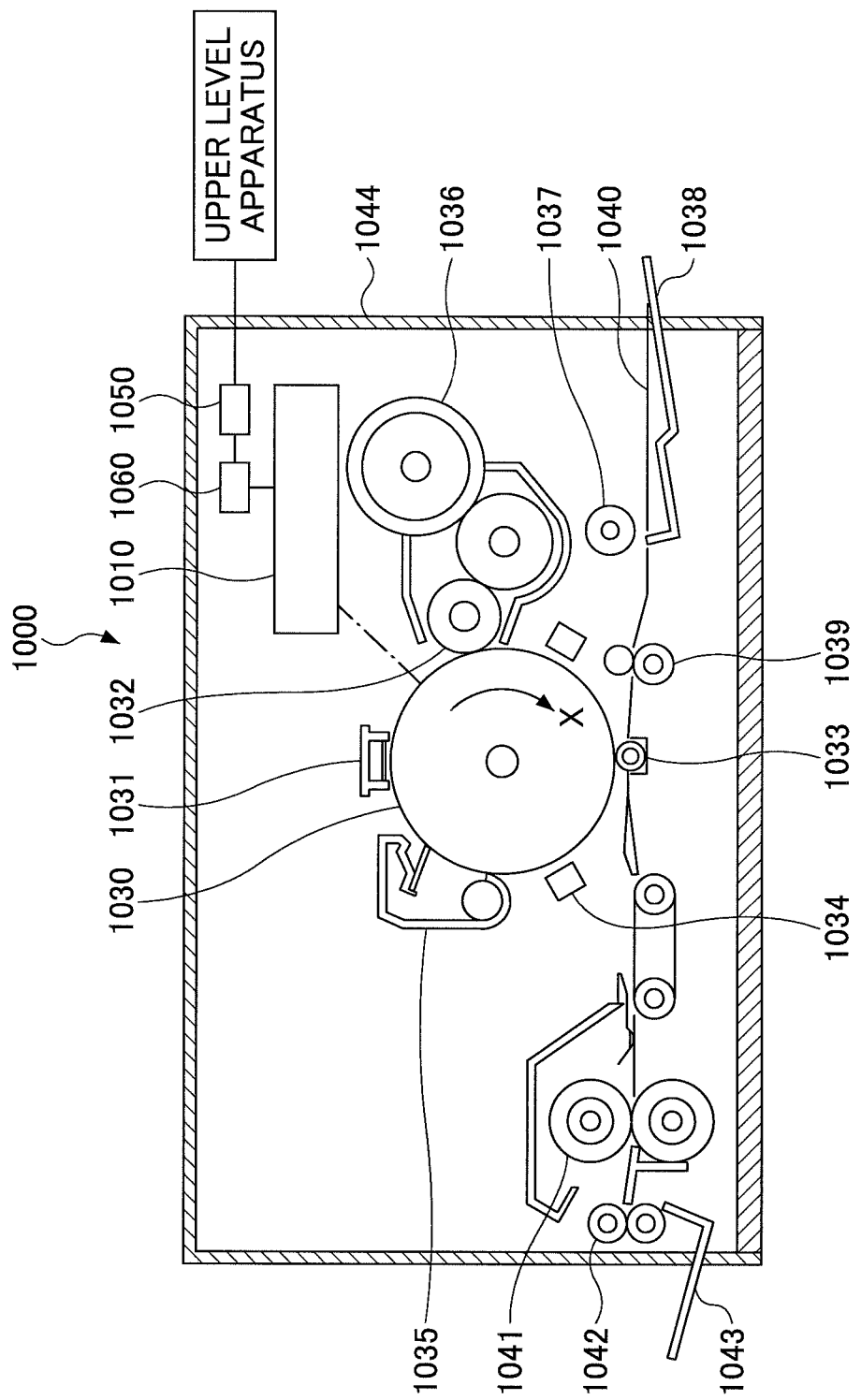
FIG. 33 is a configuration diagram of a laser printer according to a second embodiment.

Based on FIG. 33, a laser printer 1000 according to the present embodiment is described. The laser printer 1000 according to the present embodiment includes the optical scanning apparatus 1010, a photoconductor drum 1030, an electric charger 1031, a developing roller 1032, a transfer charger 1033, a neutralization unit 1034, a cleaning unit 1035, a toner cartridge 1036, a paper-supply roller 1037, a paper-supply tray 1038, a registration roller pair 1039, a fixing roller 1041, a paper-output roller 1042, a paper-output tray 1043, a communications control apparatus 1050, a printer control apparatus 1060 which exercises control of the respective elements as described above, etc. These elements are housed at predetermined positions within a printer housing 1044.

The communications control apparatus 1050 controls two-way communications with an upper-level apparatus (e.g., a personal computer) via a network, etc.

The photoconductor drum 1030, which is a cylindrically shaped member, has formed a photosensitive layer on a surface thereof. In other words, the surface of the photoconductor drum 1030 is a face to be scanned. Then, the photoconductor drum 1030 is arranged to rotate in a direction shown with an arrow X.

The electric charger 1031, the developing roller 1032, the transfer charger 1033, the neutralization unit 1034, and the cleaning unit 1035 are respectively arranged in the vicinity of the surface of the photoconductor drum 1030. Then, along a direction of rotation of the photoconductor drum 1030, they are arranged in an order of the electric charger 1031, the developing roller 1032, the transfer charger 1033, the neutralization unit 1034, and the cleaning unit 1035.

The electric charger 1031 uniformly charges a surface of the photoconductor drum 1030.

The optical scanning apparatus 1010 scans a surface of the photoconductor drum 1030 charged by the electric charger 1031 with a beam which is modulated based on image information from an upper-level apparatus, and forms a latent image which corresponds to the image information on the surface of the photoconductor drum 1030. The latent image formed here moves in a direction of the developing roller 1032 in conjunction with rotation of the photoconductor drum 1030. The configuration of the optical scanning apparatus 1010 is described below.

The toner cartridge 1036 contains toner, which is supplied to the developing roller 1032.

The developing roller 1032 adheres toner supplied from the toner cartridge 1036 onto the latent image formed on the photoconductor drum 1030 to visualize image information. Here, a latent image to which the toner is adhered (below called "a toner image" for convenience) moves in a direction of a transfer charger 1033 in conjunction with rotation of the conductor drum 1030.

Recording papers 1040 are contained in the paper-supply tray 1038. The paper-supply roller 1037, which is arranged in the vicinity of the paper-supply tray 1038, takes out the recording papers 1040 one by one from the paper-supply tray 1038, which recording papers 1040 are conveyed to the registration roller pair 1039. The registration roller pair 1039 holds the recording paper 1040 which is taken out by the paper-supply roller 1037 at one time, and also sends out the recording paper 1030 toward a gap between the photoconductor drum 1030 and the transfer charger 1033 in line with rotation of the photoconductor drum 1030.

In order to electrically attract toner on a surface of the photoconductor drum 1030 to the recording sheet 1040, a voltage with a polarity which is opposite that of the toner is applied to the transfer charger 1033. With the voltage as described above, the toner image on the surface of the photoconductor drum 1030 is transferred onto the recording sheet 1040. The thus transferred-to recording paper 1040 is sent to the fixing roller 1041.

With the fixing roller 1041, heat and pressure is applied to the recording sheet 1040, so that the toner is fixed onto the recording sheet 1040. The thus fixed recording sheet 1040 is sent to the paper-output tray 1043 via the paper-output roller 1042, and stacked on the paper-output tray 1043.

The neutralization unit 1034 neutralizes the surface of the photoconductor drum 1030.

The cleaning unit 1035 removes toner (remaining toner) remaining on the surface of the surface of the photoconductor drum 1030. The surface of the photoconductor drum 1030 with the remaining toner thereon having been removed again returns to a position which opposes the electrical charger 1031.

Figure 34:
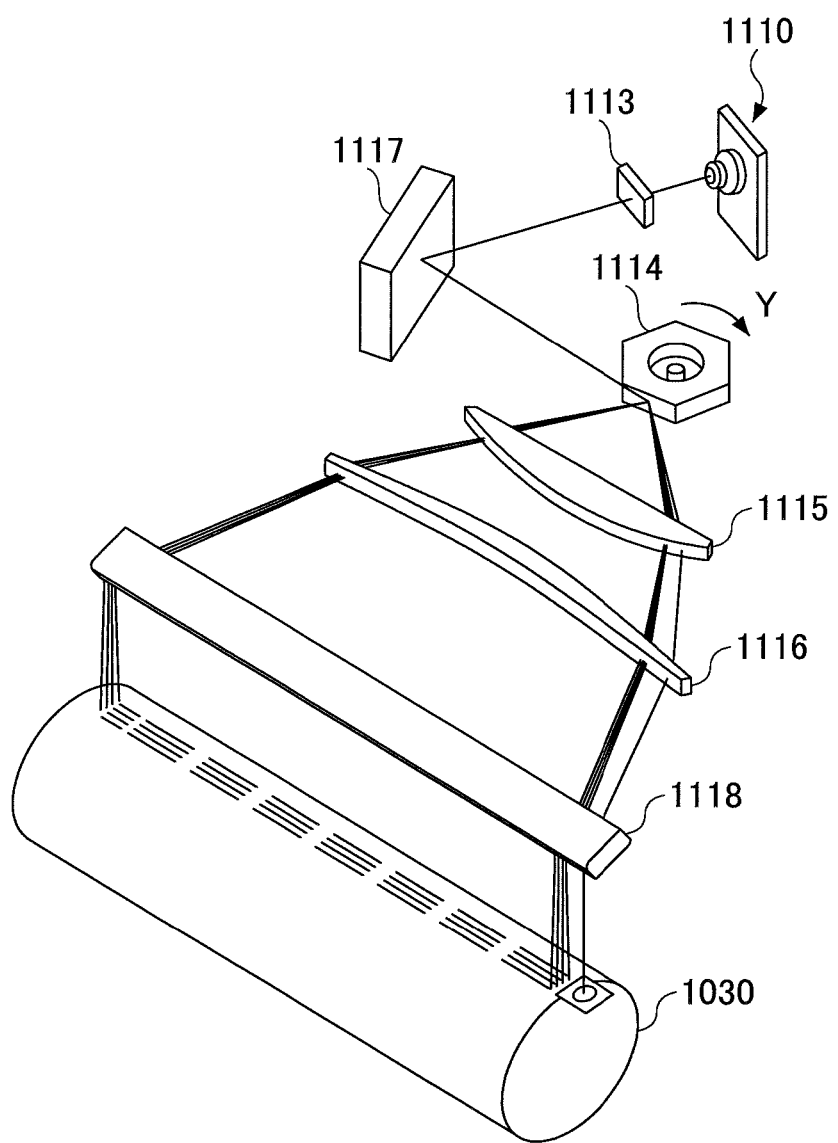
FIG. 34 is a configuration diagram of an optical scanning apparatus according to the second embodiment.

Next, the optical scanning apparatus 1010 is described based on FIG. 34. The optical scanning apparatus 1010 includes a light source unit 1110, a coupling lens and an opening plate (not shown), a cylindrical lens 1113, a polygon mirror 1114, an fθ lens 1115, a toroidal lens 1116, two mirrors 1117 and 1118, and a control apparatus (not shown) which exercises control of the above-described elements. The light source unit 1110 includes a surface emitting laser module according to the first embodiment.

The cylindrical lens 1113 collects beams emitted from the light source unit 1110 in the vicinity of a deflected reflecting face of the polygon mirror 1114 via the mirror 1117.

The polygon mirror 1114, which includes a regular hexagonal cylinder, has formed on side faces thereof six reflecting faces. Then, it is rotated at a certain angular speed in a direction shown with an arrow Y with a rotating mechanism (not shown).

Therefore, beams which are emitted from the light source unit 1110 and which are collected in the vicinity of the deflected reflecting faces of the polygon mirror 1114 by the cylindrical lens 1113 are deflected at a certain angular speed with rotation of the polygon mirror 1114.

The fθ lens 1115, which has an image height proportional to an angle of incidence of the beam from the polygon mirror 1114, moves, at an equal speed with respect to a main-scanning direction, an image face of the beam deflected at the certain angular speed by the polygon mirror 114. The toroidal lens 1116 images a beam from the fθ lens 1115 on a surface of the photoconductor drum 1030 via the mirror 1118.

The toroidal lens 1116 is arranged on an optical path of the beam via the fθ lens 1115. Then, the surface of the photoconductor drum 1030 is irradiated with the beam which has traveled via the toroidal lens 1116, so that a light spot is formed. This light spot moves in a longitudinal direction of the photoconductor drum 1030 in conjunction with rotation of the polygon mirror 1114. In other words, it scans over the photoconductor drum 1030. A moving direction of the optical spot here is "a main scanning direction". Moreover, a direction of rotation of the photo conductor drum 1030 is "a sub-scanning direction".

An optical system which is arranged on an optical path between the polygon mirror 1114 and the photoconductor drum 1030 is also called a scanning optical system. In the present embodiment, the scanning optical system includes the fθ lens 1115 and the toroidal lens 1116. At least one folding mirror may be arranged on one of an optical path between the fθ lens 1115 and the toroidal lens 1116 and an optical path between the toroidal lens 1116 and the photoconductor drum 1030.

The laser printer 1000 according to the present embodiment uses the surface emitting laser module according to the first embodiment, making it possible to perform printing without decreasing the printing speed even when writing dot density increases. Moreover, the printing speed may be further increased for the same writing dot density.

Moreover, in this case, deflecting directions of beams from the light emitting sections are stably aligned, so that the laser printer 1000 makes it possible to stably form a high-quality image.

While a case of the laser printer 1000 as an image forming apparatus is explained as a description of the present embodiment, it is not limited thereto.

For example, it may be an image forming apparatus, which directly irradiates a laser beam onto a medium (e.g., a sheet) which produces color by a laser beam.

For example, the medium may be a printing plate which is known as a CTP (Computer to plate). In other words, the optical scanning apparatus 1010 is also suitable as an image forming apparatus which directly forms an image onto a printing plate material with a laser application and forms an image plate.

Moreover, the medium may be so-called rewritable paper, for example. This is such that a material as described below is applied as a recording layer on a supporting body such as paper, resin film, etc. Then, reversibility is provided to color production with thermal energy control by a laser beam, and displaying/erasing is reversibly performed.

There are a transparent/opaque type rewritable marking scheme and a coloring/decoloring type rewritable marking scheme using leuco dye, both of which schemes may be applied herein.

With the transparent/opaque type, fatty acid fine particles are dispersed in a polymer thin film. When heated to at least 110° C., resin expands due to melting of the fatty acid. Subsequently, when cooled the fatty acid is supercooled and remains as liquid, while the expanded resin solidifies. Then, the fatty acid solidifies and contracts and becomes polycrystalline fine particles, such that gaps are formed between the resin and the fine particles. Light is scattered due to these gaps, so that the corresponding portions appear white. Then, when heated to a decoloring temperature range of 80 to 110° C., the fatty acid partially melts and the resin thermally expands such that the gaps are filled. When cooled at this time, the corresponding portions become transparent, so that the image is erased.

The rewritable marking scheme using leuco dye uses reversible coloring and decoloring reactions between colorless leuco dye and a coloring/decoloring agent having a long chain alkyl group.

When heated by laser beams, the leuco dye and the coloring/decoloring agent react to produce color, which, when rapidly cooled as it is, maintains the produced color. Subsequently, after being heated and then slowly cooled, phase separation occurs due to autoagglutination of the long alkyl group of the coloring/decoloring agent, so that the leuco dye and the coloring/decoloring agent are physically separated such that decoloring occurs.

Moreover, the medium may be so-called color rewritable paper such that a photo-chromic compound which produces a C (cyan) color when exposed to ultraviolet rays and which decolors with R (red) visible light, a photo-chromic compound which produces a M (magenta) color when exposed to ultraviolet rays and which decolors with G (green) visible light, and a photo-chromic compound which produces an Y (yellow) color which when exposed to ultraviolet rays and which decolors with B (blue) visible light are provided on a supporting body such as paper, a resin film, etc.

It may also be arranged that a completely black color is attained by exposing ultraviolet rays at one time, and then coloring densities of three types of materials which produce Y, M, and C are controlled by adjusting time and intensity of exposing R, G, and B light beams, so that a completely white color may be attained by continuing to expose intense R, G, and B beams to decolor all of the three types.

Such a mechanism which provides reversibility to coloring by optical energy control may also be realized as an image forming apparatus which is provided with an optical scanning apparatus similar to the above-described embodiment.

Moreover, an image forming apparatus which uses a silver salt film as an image carrier may also be provided. In this case, a latent image may be formed on a silver salt film by optical scanning, and this latent image may be visualized with the same process as a developing process in a typical silver salt photographing process. Then, the same process as a photo finishing process in the normal silver salt photographing process may be used for transferring onto a print sheet. Such an image forming apparatus may be embodied as a optical plate making apparatus or an optical drawing apparatus which draws CT scan images, etc.

The optical scanning apparatus 1010 according to the present embodiment includes a surface emitting laser module according to a first embodiment in the light source unit 1110, so that stable optical scanning may be performed at low cost.

Moreover, the surface emitting laser element 20 in a surface emitting laser module according to the first embodiment is a surface emitting laser array chip and includes multiple light emitting sections, so that simultaneous multiple optical scanning can be performed, making it possible to increase the speed of image forming.

Moreover, the laser printer 1000 according to the present embodiment includes an optical scanning apparatus 1010, making it possible to form high quality images.

Moreover, in the surface emitting laser array chip which is the surface emitting laser element 20, light emitting section intervals when the respective light emitting sections are orthogonally projected on an imaginary line which extends in a direction corresponding to sub-scanning are equal intervals d2, so that a timing of illumination may be adjusted to regard the present feature the same as the feature when light emitting sections are aligned at equal intervals in the sub-scanning direction on the below-described photoconductor drum 1030.

Then, high density writing at 4800 dpi (dots/inch) is possible when the above-described interval d2 is set equal to 2.65 μm and a magnification of an optical system of the optical scanning apparatus 1010 is set to ×2, for example. As a matter of course, the number of light emitting sections in the direction corresponding to the main scanning can be increased, an array can be arranged such that a pitch d1 in the sub-scanning direction is narrowed to further decrease the interval d2, and the magnification of the optical system can be decreased, etc., to increase the density and to achieve higher quality printing.

A writing interval in the main scanning direction may easily be controlled with a timing of illumination of the light emitting section.

Moreover, with the laser printer 1000 according to the present embodiment, printing may be performed without reducing the printing speed even when the writing dot density increases. Furthermore, the printing speed may be further increased for the same writing dot density. Moreover, deflecting directions of beams from the light emitting sections are stably aligned, making it possible to stably form a high-quality image.

Third Embodiment

Next, a third embodiment is described. The present embodiment is a color printer 2000 which is provided with multiple photoconductor drums.

Figure 35:
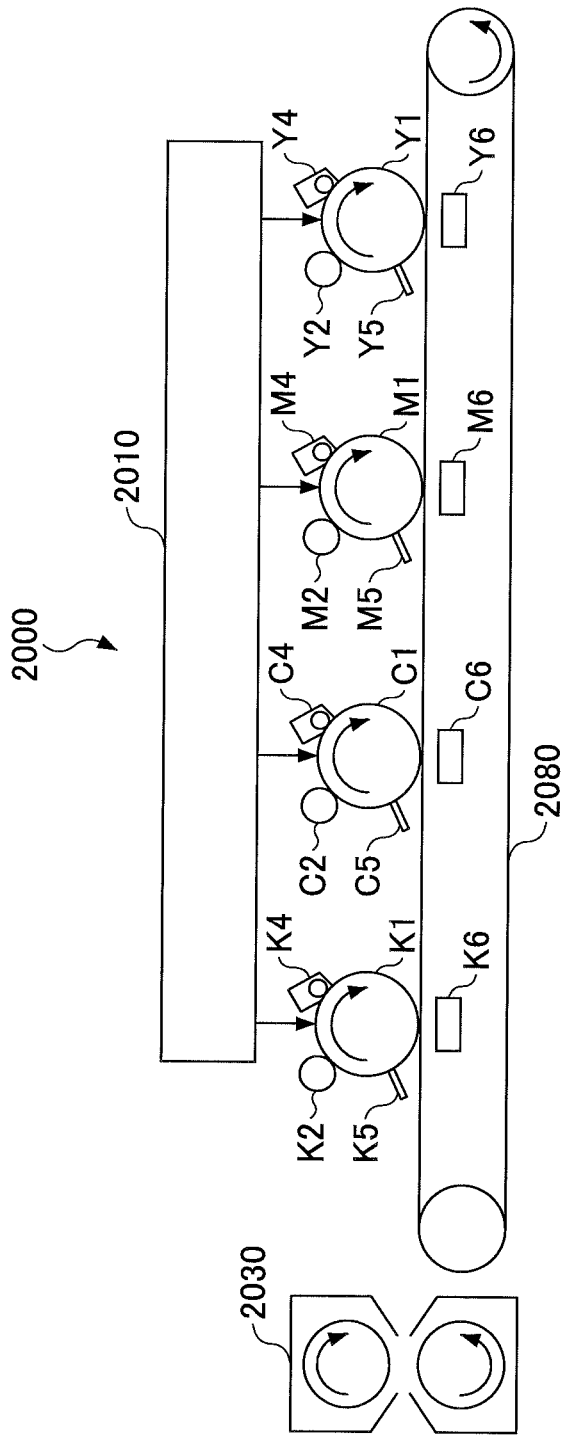
FIG. 35 is a configuration diagram of a color printer according to a third embodiment.

Based on FIG. 35, a color printer 2000 according to the present embodiment is described. The color printer 2000 according to the present embodiment, which is a tandem type multi-color printer which forms a full color image by superposing four colors (black, cyan, magenta, and yellow), includes a station for black (a photoconductor drum K1, a charging apparatus K2, a developing apparatus K4, a cleaning unit K5, and a transfer apparatus K6), a station for cyan (a photoconductor drum C1, a charging apparatus C2, a developing apparatus C4, a cleaning unit C5, and a transfer apparatus C6), a station for magenta (a photoconductor drum M1, a charging apparatus M2, a developing apparatus M4, a cleaning unit M5, and a transfer apparatus M6), and a station for yellow (a photoconductor drum Y1, a charging apparatus Y2, a developing apparatus Y4, a cleaning unit Y5, and a transfer apparatus Y6), an optical scanning apparatus 2010, a transfer belt 2080, a fixing unit 2030, etc.

Each photoconductor drum rotates in an arrowed direction shown in FIG. 35, around which photoconductor drum the charging apparatus, the developing apparatus, the transfer apparatus, and the cleaning unit are arranged in an order of rotation. Each charging apparatus uniformly charges a surface of a corresponding photoconductor drum. The optical scanning apparatus 2010 is arranged to irradiate light onto a surface of each photoconductor drum that is charged by the corresponding charging apparatus, so that a latent image is formed on each conductor drum. Then, the corresponding developing apparatus forms a toner image on a surface of each photoconductor drum. Moreover, the corresponding transfer apparatus transfers a toner image of each color onto recording paper on the transfer belt 2080 and finally the fixing unit 2030 fixes the image onto the recording paper.

The optical scanning apparatus 2010, which includes, for each color, a light source unit including the surface emitting laser module according to the first embodiment, makes it possible to obtain the same advantageous effect as the optical scanning apparatus 1010 which is described in the second embodiment. Moreover, the color printer 2000 includes the above-described optical scanning apparatus 2010, making it possible to obtain the same advantageous effect as the laser printer 1000 according to the second embodiment.

Now, in the color printer 2000, a color shift may occur due to manufacturing errors and positional errors, etc., of components. Even in such a case, each light source of the optical scanning apparatus 2010 includes the light source unit including the surface emitting laser module according to the first embodiment, making it possible to reduce the color shift by selecting the light emitting section to be illuminated.

Thus, the color printer 2000 according to the present embodiment uses a surface emitting laser module according to the first embodiment, making it possible to form high-quality images.

While the embodiments of the present embodiment have been described in the foregoing, the present invention is not limited thereto.

The present invention is based on Japanese Priority Application No. 2010-292109, filed Dec. 28, 2010 and Japanese Priority Application No. 2011-240615, filed Nov. 1, 2011, the entire contents of which are hereby incorporated by reference.

The invention claimed is:

1. An optical device, comprising:
a surface emitting laser element having a surface emitting laser which emits a light in a direction which is perpendicular to a substrate face;
a light receiving clement which monitors the light of the surface emitting laser;
a package provided with a region on which the surface emitting laser element and the light receiving element are provided;
a lid which has a window through which passes the light of the surface emitting laser, the window being formed of a transparent member, and which covers the surface emitting laser element and the light receiving element;
a reflecting film provided on a lower face of the transparent member of the window onto which the light from the surface emitting laser element is incident, wherein the reflecting film partially reflects the light from the surface emitting laser element; and
a reflection preventing film provided on an upper face of the transparent member of the window, wherein the upper face is opposite the lower face on which the first film layer is provided, and the reflection preventing film prevents reflection of a portion of the light that is not reflected by the reflecting film, and
wherein the transparent member is provided at an angle which is tilted relative to the substrate face, and the lid is connected to the package such that the light emitted from the surface emitting laser is partially reflected at the reflecting film and is incident on the tight receiving element.

2. An optical device, comprising:
a surface emitting laser element having a surface emitting laser which emits a light in a direction which is perpendicular to a substrate face;
a light receiving element which monitors the light of the surface emitting laser; a package provided with a region on which the surface emitting laser element and the light receiving element are provided;
a lid which has a window through which passes the light of the surface emitting laser, the window being formed of a transparent member, and which covers the surface emitting laser element and the light receiving element;
a reflecting film provided on a lower face of the transparent member of the window onto which the light from the surface emitting laser element is incident, wherein the reflecting film partially reflects the light from the surface emitting laser element; and
a reflection preventing film provided on an upper face of the transparent member of the window, wherein the upper face is opposite the lower face of the transparent member of the window on which the reflecting film is provided, and the reflection preventing film prevents reflection of a portion of the light that is not reflected by the reflecting film, and
wherein the transparent member is provided at an angle which is tilted relative to the substrate face, and the lid is connected to the package such that the light emitted from the surface emitting laser is reflected due to a difference between a refractive index of the transparent bet and a refractive index of air or gas in the air and is incident on the light receiving element.

3. The optical device as claimed in claim 1, wherein
the surface emitting laser element is provided on a bottom face of the package and the light receiving element is provided at a position which is higher than the bottom face.

4. The optical device as claimed in claim 3, wherein
the light receiving element is provided on a stage provided on the bottom face of the package and a wiring is formed between the bottom face and the stage.

5. The optical device as claimed in claim 1, wherein
a light receiving face at the light receiving element has a circular shape.

6. The optical device as claimed in claim 1, wherein
a concave-convex section having a pitch which is smaller than a wavelength of the light is provided on a surface of the transparent member in place of the reflection preventing film.

7. The optical device as claimed in claim 1, wherein
the reflecting film is a dielectric multi-layer film.

8. The optical device as claimed in claim 1, wherein
a reflectance of the reflecting film is 3-15% at a wavelength of the light emitted from the surface emitting laser.

9. The optical device as claimed in claim 1, wherein
the lid is provided with a lid connecting section, the package is provided with a package connecting section, and the lid connecting section and the package connecting section are to be connected with an adhesive, wherein
a water content transmitting region is formed by providing, between the package connecting section and the lid connecting section, a region on which the adhesive is not applied.

10. The optical device as claimed in claim 9, wherein wherein a size of an opening portion at the water content transmitting region is no more than 2 μm.

11. The optical device as claimed in claim 1, wherein
the transparent member is tilted at least 10 degrees relative to a face which is perpendicular to the light emitted from the surface emitting laser.

12. The optical device as claimed in claim 1, wherein
the lid is formed by being integrally molded with a transparent resin member.

13. The optical device as claimed in claim 1, wherein
the resin material is formed of one of PMMA, cyclic olefin copolymer resin, and polyester resin.

14. The optical device as claimed in claim 1, wherein
the lid has the transparent member joined to a lid body;
the lid body is formed by molding with a metal material; and
the transparent member is fixed from inside of the lid body with a low melting point glass which melts at a temperature of 500° C. or less.

15. The optical device as claimed in claim 1, wherein
the surface emitting laser element is provided with plural of the surface emitting lasers.

16. The optical device as claimed in claim 15, wherein
the plural surface emitting lasers are at least 10.

17. An optical scanning apparatus which scans a face to be scanned with a light, comprising:
a light source having the optical device as claimed in claim 1;
a light deflecting section which deflects a light from the light source; and a scanning optical system which collects, onto the face to be scanned, the light which is deflected by the light deflecting section.

18. An image forming apparatus, comprising:

an image carrier; and the optical scanning apparatus as claimed in claim 17, the optical scanning apparatus scanning a modulated light in accordance with image information onto the image carrier.

19. The image forming apparatus as claimed in claim 18, wherein multiple of the image carriers are provided, and the image information is multi-color information.

* * * * *